(12) United States Patent
Schwindt et al.

(10) Patent No.: US 7,859,350 B1
(45) Date of Patent: Dec. 28, 2010

(54) MICROFABRICATED ION FREQUENCY STANDARD

(75) Inventors: Peter Schwindt, Albuquerque, NM (US); Grant Biedermann, Albuquerque, NM (US); Matthew G. Blain, Albuquerque, NM (US); Daniel L. Stick, Albuquerque, NM (US); Darwin K. Serkland, Albuquerque, NM (US); Roy H. Olsson, III, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 91 days.

(21) Appl. No.: 12/431,564

(22) Filed: Apr. 28, 2009

(51) Int. Cl.
*H03L 7/26* (2006.01)
(52) U.S. Cl. .......................... 331/94.1; 331/3
(58) Field of Classification Search ............... 331/3, 331/94.1
See application file for complete search history.

(56) References Cited

U.S. PATENT DOCUMENTS

| | | | |
|---|---|---|---|
| 4,193,029 A * | 3/1980 | Cioccio et al. ............. 324/301 |
| 5,493,577 A | 2/1996 | Choquette et al. | |
| 5,501,893 A | 3/1996 | Laermer et al. | |
| 5,596,186 A | 1/1997 | Kobayashi | |
| 6,171,378 B1 | 1/2001 | Manginell et al. | |
| 6,384,473 B1 | 5/2002 | Peterson et al. | |
| 6,393,038 B1 | 5/2002 | Raymond et al. | |
| 6,521,014 B2 | 2/2003 | Toia et al. | |
| 6,538,312 B1 | 3/2003 | Peterson et al. | |
| 6,661,084 B1 | 12/2003 | Peterson et al. | |
| 7,339,454 B1 | 3/2008 | Fleming | |
| 7,372,346 B2 | 5/2008 | Tilmans et al. | |
| 7,378,913 B2 * | 5/2008 | Laiacano et al. ............ 331/3 |
| 7,385,334 B1 | 6/2008 | Olsson et al. | |
| 2002/0175767 A1 * | 11/2002 | Kitching et al. ............ 331/3 |
| 2007/0040113 A1 | 2/2007 | Monroe et al. | |

OTHER PUBLICATIONS

L.E. Myers. et al., "Quasi-phase-matched optical parametric oscillators in bulk periodically poled LiNbO$_3$", J.Opt.Soc.Am B/vol. 12, No. 11, Nov. 1995, pp. 2102-2116.

Peter T. H. Fisk et al., "Accurate Measurement of the 12.6 GHz "Clock" Transition in Trapped $^{171}$Yb$^+$ Ions", IEEE Transactions on Ultrasonics, Ferroelectrics and Frequency Control, vol. 44, No. 2 Mar. 1997, pp. 344-354.

(Continued)

*Primary Examiner*—Joseph Chang
(74) *Attorney, Agent, or Firm*—John P. Hohimer

(57) ABSTRACT

A microfabricated ion frequency standard (i.e. an ion clock) is disclosed with a permanently-sealed vacuum package containing a source of ytterbium (Yb) ions and an octupole ion trap. The source of Yb ions is a micro-hotplate which generates Yb atoms which are then ionized by a ultraviolet light-emitting diode or a field-emission electron source. The octupole ion trap, which confines the Yb ions, is formed from suspended electrodes on a number of stacked-up substrates. A microwave source excites a ground-state transition frequency of the Yb ions, with a frequency-doubled vertical-external-cavity laser (VECSEL) then exciting the Yb ions up to an excited state to produce fluorescent light which is used to tune the microwave source to the ground-state transition frequency, with the microwave source providing a precise frequency output for the ion clock.

23 Claims, 11 Drawing Sheets

OTHER PUBLICATIONS

J.P. Meyn et al., "Tunable ultraviolet radiation by second-harmonic generation in periodically poled lithium tantalate", Optics Letters, Aug. 15, 1997, pp. 1214, vol. 22, No. 16.

John D. Prestage et al., "Recent Developments in Microwave Ion Clocks", Topics in Applied Physics, Frequency Measurement and Control, vol. 79, pp. 195-211 (Springer-Verlag, Berlin, 2001).

Christian Tamm et al., "Trapped Ion Optical Frequency Standards for Laboratory Tests of Alpha-Variability", Lecture Notes in Physics: Astrophysics, Clocks and Fundamental Constants (Springer-Verlag, 2004) pp. 247-261.

R. B. Warrington et al., "Development of a $^{171}Yb^+$ Microwave Frequency Standard at the National Measurement Institute, Australia", Proceedings of the 2005 IFCS, Vancouver, Canada, pp. 611-615, 2007.

Wanling Pan et al, "A surface micromachined electrostatically tunable film bulk acoustic resonator", Sensors and Actuators A, 126 (2006) pp. 436-446.

D. Cruz et al., "Design, microfabrication, and analysis of micrometer-sized cylindrical ion trap arrays", Review of scientific Instruments, vol. 78, (2007) pp. 015107-1 through -9.

S. J. Park et al, "$^{171}Yb^+$ Microwave Frequency Standard" Proceedings of the 2007 IFCS, Geneva, Switzerland, pp. 613-616, 2007.

John D. Prestage et al, "Atomic Clocks and Oscillators for Deep-Space Navigation and Radio Science", Proceedings of the IEEE, vol. 95, No. 11, Nov. 2007, pp. 2235-2247.

Roy H. Olsson III et al, "Microfabricated VHF acoustic crystals and waveguides", Sensors and Actuators A 145-146, (2008), pp. 87-93.

R. H. Olsson III et al, "Microfabricated phononic crystal devices and applications", Measurement Science and Technology, vol. 20 (2009) 012002 (13 pp).

M. Asif Khan et al, "III-Nitride UV Devices", Japanese Journal of Applied Physics, vol. 44, No. 10, 2005, pp. 7191-7206.

* cited by examiner

MICROFABRICATED ION FREQUENCY STANDARD

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to frequency standards which are also referred to as ion clocks, and in particular to a microfabricated ion frequency standard which utilizes ytterbium (Yb) ions.

BACKGROUND OF THE INVENTION

Among the best modern clocks are those which employ long-lived ground-state hyperfine transitions of mercury (Hg) ions to achieve stability and accuracy levels exceeding $10^{-15}$ (see e.g. J. D. Prestage et al, "Atomic Clocks and Oscillators for Deep-Space Navigation and Radio Science," *Proceedings of the IEEE*, vol. 95, pp. 2235-2247, November 2007). This Hg ion clock is relatively large and bulky with a physics package which occupies about 1000 cubic centimeters (cc), and with an overall weight of the Hg ion clock being about 2-3 kilograms (kg). Further significant reductions in the size, weight and electrical power for the Hg ion clock are hampered by the requirements for ion shuttling and for the use of a $^{202}$Hg discharge lamp to provide deep ultraviolet (UV) radiation at 194 nanometers (nm) for optical pumping of $^{199}$Hg$^+$ ions.

There is a current need for ion clocks (also referred to herein as ion frequency standards) which are about 100 times smaller than the Hg ion clock with a commensurate reduction in weight and required electrical power. Such small-size ion clocks have applications for use in nano satellites and unmanned aerial vehicles (UAVs).

The ion frequency standard of the present invention provides an advance in the art by providing an ion clock which operates using ytterbium (Yb) ions in a size, weight and electrical power requirement which are significantly less than those required for conventional Hg ion clocks.

The ion frequency standard of the present invention also utilizes a permanently-sealed vacuum package (also termed a vacuum housing) wherein the Yb ions are generated and isolated in an octupole ion trap without the need for any shuttling of the Yb ions.

Microwave radiation for the ion frequency standard of the present invention can be generated using an acoustic oscillator which can comprise a film bulk acoustic wave (FBAR) oscillator, a microresonator oscillator or an acoustic bandgap (ABG) oscillator. These acoustic oscillators are compact and rugged, and require relatively low electrical power to generate the microwave radiation.

Optical sources and detectors for the ion frequency standard of the present invention can be located on a common substrate to reduce the size, weight and electrical power requirements for these components which are needed for optical interrogation of the Yb ions.

These and other advantages of the present invention will become evident to those skilled in the art.

SUMMARY OF THE INVENTION

The present invention relates to a microfabricated ion frequency standard which comprises a source of ytterbium (Yb) ions and an octupole ion trap to confine the Yb ions. A microwave source is used to irradiate the Yb ions at a frequency which is substantially equal to a ground-state transition frequency of the Yb ions, thereby exciting the Yb ions from a ground-state lower hyperfine level into a ground-state upper hyperfine level. A frequency-doubled vertical-external-cavity surface-emitting laser (VECSEL) can then be used to irradiate the Yb ions in the ground-state upper hyperfine level, thereby exciting the Yb ions from the ground-state upper hyperfine level into an excited-state level. The Yb ions in the excited-state level decay with the emission of fluorescent light which can be detected by a photodetector to generate an electrical output signal which is used in a feedback loop to tune the frequency of the microwave source to the ground-state transition frequency.

The octupole ion trap is formed from a plurality of substrates (e.g. four silicon substrates) which are stacked up one upon the other. Each substrate has an opening therethrough in which a pair of electrodes (e.g. comprising tungsten) are suspended. The electrodes, when activated with radio-frequency (rf) and direct-current (dc) electrical signals, provide electric fields which confine the Yb ions within a trap volume of the octupole ion trap.

The source of Yb ions comprises a micro-hotplate having a suspended membrane. An electrical heater is located on the suspended membrane with a layer of ytterbium (Yb) being in thermal communication with the electrical heater. When the electrical heater is activated with an electrical current, Yb atoms are released in a cloud from the Yb layer. An ionization source then ionizes the Yb atoms in the cloud to generate the Yb ions. The ionization source can comprise an ultraviolet (UV) light-emitting diode (LED) which photoionizes the Yb atoms. Alternately, the ionization source can be a field-emission electron source which produces electrons which collide with the Yb atoms to generate the Yb ions by electron impact ionization.

The micro-hotplate and the octupole ion trap are both located inside of a permanently-sealed vacuum package having a window to provide optical access to the trap volume. The permanently-sealed vacuum package can comprise a low-temperature cofired ceramic (LTCC) housing. The permanently-sealed vacuum package can also include a non-evaporable getter and a buffer gas.

The microwave source can comprise an acoustic oscillator such as an acoustic bandgap (ABG) oscillator, a microresonator oscillator or a film bulk acoustic wave (FBAR) oscillator. The fluorescent light can be collected and directed to the photodetector using one or more diffractive optical elements. A magnetic shield and magnetic-field-cancelling coils can also be located about the octupole ion trap to substantially cancel a background magnetic field within the trap volume, and to provide a C-field in the trap volume.

To re-pump the Yb ions which decay from the excited-state level into a metastable excited-state level, near-infrared light from a near-infrared LED can be used. The near-infrared light excites the Yb ions from the metastable excited-state level into a higher-lying excited state which allows the Yb ions to decay back to the ground-state lower hyperfine level.

The present invention also relates to a microfabricated ion frequency standard which comprises a permanently-sealed vacuum package having a window with an octupole ion trap and a micro-hotplate both being located within the permanently-sealed vacuum package. The octupole ion trap comprises a plurality of substrates which are stacked one upon the other with an opening being formed through the substrates, and with a plurality of electrodes being located about the opening to define a trap volume for the octupole ion trap. The micro-hotplate comprises a suspended membrane on which an electrical heater is located, with a layer of Yb being in thermal communication with the electrical heater to generate a cloud of Yb atoms upon activation of the electrical heater with an electrical current. The Yb atoms are then ionized to generate Yb ions which are confined within the trap volume of the octupole ion trap. The ionization of the Yb atoms can be performed using either UV light from a UV LED which is located outside of the permanently-sealed vacuum package, or alternately using electrons from a field-emission source which is located inside the vacuum package.

A microwave source, a laser and a photodetector are provided in the microfabricated ion frequency standard, with each of these elements being located outside of the permanently-sealed vacuum package. The microwave source provides microwave radiation at a frequency which is substantially equal to a ground-state transition frequency of the Yb ions. This microwave radiation, which is coupled into the trap volume, excites the Yb ions from a ground-state lower hyperfine level into a ground-state upper hyperfine level.

The laser, which can comprise a frequency-doubled VEC-SEL, provides light at a wavelength of about 369 nm with the 369-nm light being directed through the window to excite the Yb ions from the ground-state upper hyperfine level into an excited-state level. The Yb ions then decay from the excited-state level back to the ground-state hyperfine level by emitting fluorescent light.

The photodetector detects the fluorescent light and generates an electrical output signal which can be provided in a feedback loop to the microwave source to tune the frequency of the microwave source to the ground-state transition frequency of the Yb ions. A near-infrared LED can also be located outside of the permanently-sealed vacuum package and used to generate near-infrared light which is directed through the window to stimulate any of the Yb ions in a metastable excited-state level to return back to the ground-state lower hyperfine level.

The permanently-sealed vacuum package can comprise a low-temperature cofired ceramic (LTCC) housing. The microwave source can comprise an acoustic oscillator which can be an ABG oscillator, a microresonator oscillator or a FBAR oscillator. These acoustic oscillators can be compact (e.g. 1-3 cm$^{-3}$), and can operate with a relatively low electrical power input of a few tens of milliWatts (mW).

The fluorescent light can be directed to the photodetector by a diffractive optical element (i.e. a diffractive lens or a diffractive mirror, or both). A 45-degree turning mirror can also be located inside the permanently-sealed vacuum package to direct the 369-nm light into the trap volume along a longitudinal axis of the octupole ion trap.

The housing can be evacuated and back-filled with a buffer gas at a reduced pressure (e.g. helium or neon at about 10$^{-6}$ Torr). The buffer gas is useful to provide a collisional cooling mechanism for the Yb ions after they have been generated. A non-evaporable getter can also be provided in the housing to maintain a high purity atmosphere in the housing. The non-evaporable getter provides a relatively high pumping speed for atmospheric constituents but does not pump noble gases such as helium or neon.

Additional advantages and novel features of the invention will become apparent to those skilled in the art upon examination of the following detailed description thereof when considered in conjunction with the accompanying drawings.

The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
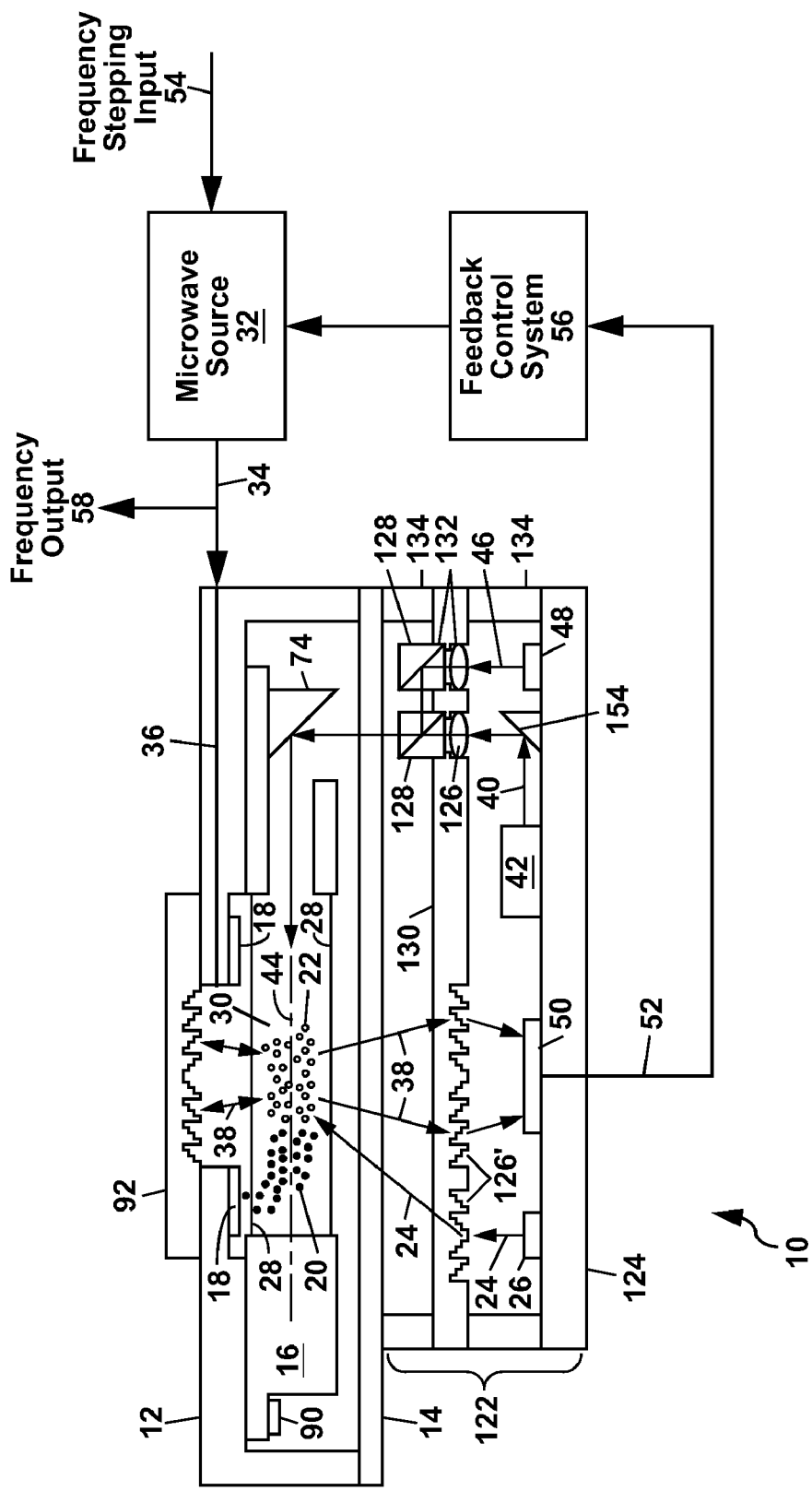
FIG. 1 schematically illustrates a first example of a microfabricated ion frequency standard according to the present invention.

Referring to FIG. 1 there is shown a schematic diagram of a first example of a microfabricated ion frequency standard 10 according to the present invention. The microfabricated ion frequency standard 10, which is also referred to herein as an ion clock, comprises a permanently-sealed vacuum package 12 having a window 14. An octupole ion trap 16 is located inside the permanently-sealed vacuum package 12 together with one or more micro-hotplates 18 which can be used to generate a cloud of Yb atoms 20. The Yb atoms 20, which are preferably $^{171}$Yb atoms, are ionized and converted to Yb ions 22. In the example of FIG. 1, this is done using photoionization produced by ultraviolet (UV) light 24 from a UV light-emitting diode (LED) 26 which is located outside of the vacuum package 12, with the UV light 24 being directed through the window 14 to irradiate the Yb atoms 20. Due to a relatively long storage time (e.g. hours) of the Yb ions 22 in the octupole ion trap 16, the Yb ions 22 will only need to be occasionally replenished using the micro-hotplate 18 and the UV LED 26.

Each Yb atom 20 can be ionized using two photons of the UV light 24 with a first photon being at a wavelength of 399 nm and a second photon being at a wavelength of 394 nm. Both photons of the UV light 24, which are needed to ionize each Yb atom 20, are generated by the UV LED 26 which can have a relatively broad spectral bandwidth of up to a few tens of nanometers which is centered near either of the above wavelengths (i.e. 399 or 394 nm).

After the Yb ions 22 have been produced, the ions 22 can be confined within the octupole ion trap 16 using a combination of radio frequency (rf) and direct current (dc) electrical signals which are applied to a plurality of electrodes 28 in the ion trap 16. The rf and dc electrical signals provide electric fields which interact with the charge on the Yb ions 22 to confine the ions 22 in the trap 16. A trap volume 30 wherein the Yb ions 22 are confined is located inside the plurality of electrodes 28 with on the order of $10^6$ or more Yb ions 22 being located in the trap volume 30 during operation of the ion clock 10. The trap volume can be, for example, on the order of 0.1 cm$^{-3}$.

A microwave source 32 (also referred to herein as an oscillator) is located outside of the vacuum package 12. The microwave source 32 generates a microwave signal 34 (also referred to herein as microwave radiation) at a frequency of about 12.6 GigaHertz (GHz). This microwave radiation 34 can be coupled into the permanently-sealed vacuum package 12 using a microwave waveguide 36 which forms a parallel-plate waveguide cavity to provide a near field pattern of the microwave radiation 34 which extends into the trap volume 30 to excite the Yb ions 22 therein. The Yb ions 22 can be initially in a ground-state lower hyperfine level (i.e. a $|^2S_{1/2}, F=0, m_F=0\rangle$ state).

Figure 2:
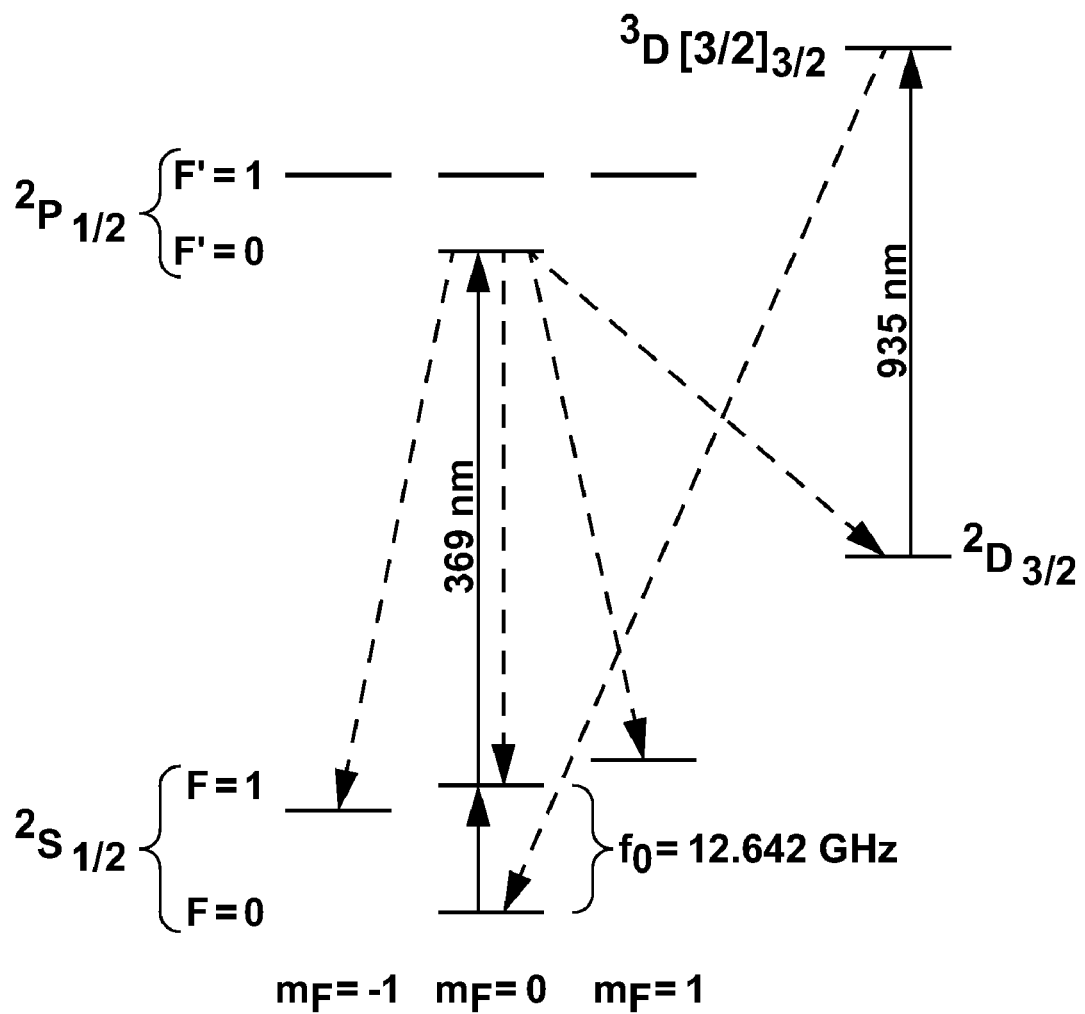
FIG. 2 shows an energy level diagram for $^{171}$Yb ions which are used in the ion frequency standard of the present invention.

This ground-state lower hyperfine level and the other energy levels of interest for the ion frequency standard 10 are shown in FIG. 2 which is an energy level diagram for the Yb ions 22 (i.e. $^{171}$Yb$^+$) with a series of dashed and solid arrows to indicate the various transitions in the Yb ions which are excited during operation of the ion frequency standard 10.

With all light sources described hereinafter being off, a π pulse of the microwave radiation 34 from the source 32 can be injected into the trap volume 30 using the parallel-plate waveguide cavity formed by the microwave waveguide 36. This π pulse of the microwave radiation 34 will be tuned into resonance with a ground-state transition frequency of the Yb ions 22 during operation of the ion frequency standard 10. The ground-state transition frequency (referred to hereinafter as $f_0$) is defined herein as a frequency separation between the two $^2S_{1/2}$, $m_F=0$ states of the Yb ions 22 with F=0 and F=1, respectively, in FIG. 2. These states are designated using the nomenclature $|^2S_{1/2}, F=0, m_F=0\rangle$ and $|^2S_{1/2}, F=1, m_F=0\rangle$. The π pulse of the microwave radiation 34 can be applied for an interrogation time $T_R$ of up to a few seconds (e.g. 1-5 seconds) during each measurement cycle of the ion clock 10 which can last for about 6-12 seconds.

To measure the frequency of the microwave radiation 34 relative to the Yb ground-state transition frequency $f_0$, the Yb ions are excited from the ground-state upper hyperfine level $|^2S_{1/2}, F=1, m_F=0\rangle$ to an excited-state level (i.e. a $|^2P_{1/2}, F'=0, m_F=0\rangle$ state as shown in FIG. 2). The excited Yb ions 22 then decay back to one of the ground-state upper hyperfine levels (i.e. to one of the $|^2S_{1/2}, F=1, m_F=0, \pm1\rangle$ states as shown in FIG. 2) by emitting photons at 369 nm, with the emitted photons forming fluorescent light 38 as shown in FIG. 1. Since the number of photons in the fluorescent light 38 is proportional to the Yb ion population in the $|^2S_{1/2}, F=1, m_F=0\rangle$ ground-state upper hyperfine level, the intensity of the detected fluorescent light 38 can be used to tune the frequency of the microwave radiation 34 from the microwave source 32 to the ground-state transition frequency $f_0$ for the Yb ions 22. When the frequency of the microwave radiation 34 from the source 32 is exactly equal to the ground-state transition frequency $f_0$, the intensity of the detected fluorescent light 38 will be at a maximum.

To excite the Yb ions 22 and generate the fluorescent light 38, laser light 40 from a frequency-doubled vertical-external-cavity surface-emitting laser (VECSEL) 42 is used in the ion clock 10 of FIG. 1. This laser light 40 with a wavelength of 369 nm, is directed through the window 14 and into the trap volume 30 along a longitudinal axis 44 of the octupole ion trap 16 immediately after the π pulse of the microwave radiation 34. The frequency-doubled VECSEL 42 can be pulsed or gated to provide the laser light 40 only when needed for excitation of the Yb ions 22 (e.g. for about 0.1 seconds or less during each measurement cycle). Since the transition $|^2P_{1/2}, F'=0, m_F=0\rangle$ to $|^2S_{1/2}, F=0, m_F=0\rangle$ is electric-dipole forbidden, the excited Yb ions 22 can decay back to the $|^2S_{1/2}, F=0, m_F=0\rangle$ ground-state lower hyperfine level by first decaying from the $|^2P_{1/2}, F'=0, m_F=0\rangle$ state to a metastable excited-state level (i.e. a $^2D_{3/2}$ state as shown in FIG. 2) and then by being excited from the $^2D_{3/2}$ metastable level to a higher-lying excited state (i.e. a $^3D[3/2]_{3/2}$ state as shown in FIG. 2).

Near-infrared light 46 at a wavelength of 935 nm from a near-infrared LED 48 or alternately a near-infrared vertical-cavity surface-emitting laser (VCSEL) can be directed through the window 14 and along the longitudinal axis 44 of the octupole ion trap 16 to re-pump the Yb ions 22 from the $^2D_{3/2}$ metastable level into the $^3D[3/2]_{3/2}$ higher-lying excited state as shown in the Yb ion energy level diagram of FIG. 2. The Yb ions 22 then decay from the $^3D[3/2]_{3/2}$ state to the $|^2S_{1/2}, F=0, m_F=0\rangle$ ground-state lower hyperfine level. Each Yb ion 22 can generate on average about 2000 photons of the fluorescent light 38 before decaying to the $^2D_{3/2}$ state and subsequently being re-pumped by the 935 nm near-infrared light 46 and then decaying back to the $|^2S_{1/2}, F=0, m_F=0\rangle$ ground-state lower hyperfine level. The near-infrared LED 48 or VCSEL can also be operated in a pulsed mode, and can be switched off when not needed for re-pumping of the Yb ions 22. The near-infrared LED 48 or VCSEL can be switched on coincident with or immediately after the laser light 40; and after a fraction of a second excitation with the near-infrared light 46, all of the Yb ions 22 will be returned to the ground-state lower hyperfine level to conclude each measurement cycle for the ion clock 10. Another measurement cycle can then be initiated using another π pulse of the microwave radiation 34 from the source 32.

The fluorescent light 38 in the ion clock 10 can be detected using a photodetector 50 which generates an electrical output signal 52 which is proportional to the intensity of the detected fluorescent light 38. The electrical output signal 52 can be amplified, as needed, and then utilized in a feedback loop to control the frequency of the microwave source 32 in order to tune the frequency to the ground-state transition frequency of the Yb ions 22. The frequency of the microwave source 32 can then be tuned to a maximum of the electrical output signal 52. The electrical output signal 52 can also be used to tune the output 40 of the frequency-doubled VECSEL 42 to the $|^2S_{1/2}, F=1, m_F=0>$ to $|^2P_{1/2}, F'=0, m_F=0>$ transition using another feedback control loop (not shown).

Another way of utilizing the electrical output signal 52 to control and tune the frequency of the microwave source 32 is to alternately step the frequency of the microwave source 32 back and forth on either side of a resonance curve for the $|^2S_{1/2}, F=0, m_F=0>$ to $|^2S_{1/2}, F=1, m_F=0>$ transition between the ground-state hyperfine levels using a frequency-stepping input 54 to the microwave source 32. The frequency-stepping input 54 can be, for example, a square-wave voltage provided by a computer or from a feedback control system 56 which is used to abruptly change the frequency of the microwave radiation 34 from the source 32 up and down in frequency by a very small amount which can be a fraction of one Hertz (Hz). This abrupt change in frequency, which is referred to herein as frequency hopping, can be used to center the frequency from the microwave source 32 at the ground-state transition frequency $f_0$ of the Yb ions 22 as schematically illustrated in FIGS. 3A and 3B.

Figure 3A:
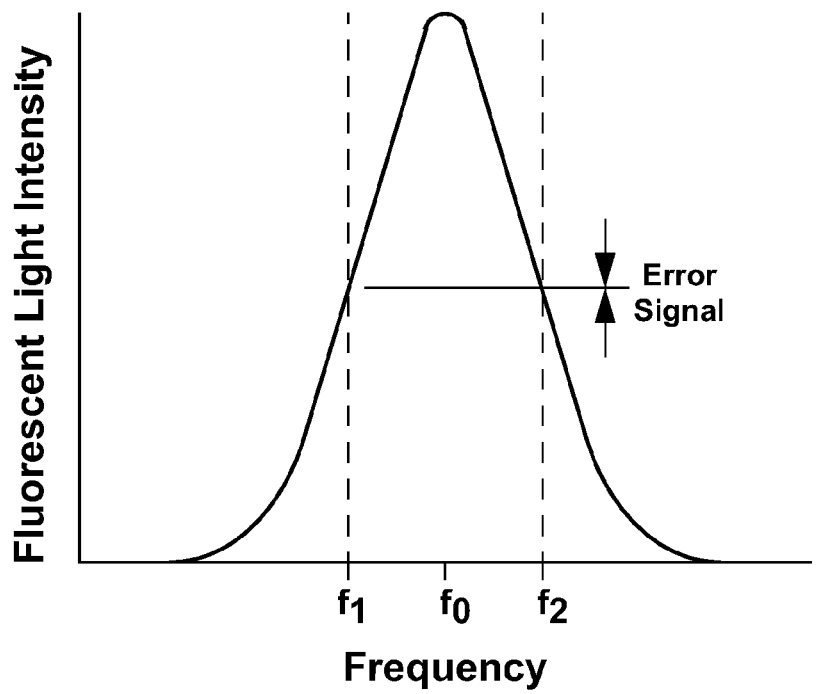
FIGS. 3A and 3B show resonance curves for the fluorescent light intensity from the Yb ions as a function of the frequency of the microwave source to illustrate the use of frequency hopping to generate an error signal which can be used to tune the microwave source to the ground-state transition frequency $f_0$.
Figure 3B:
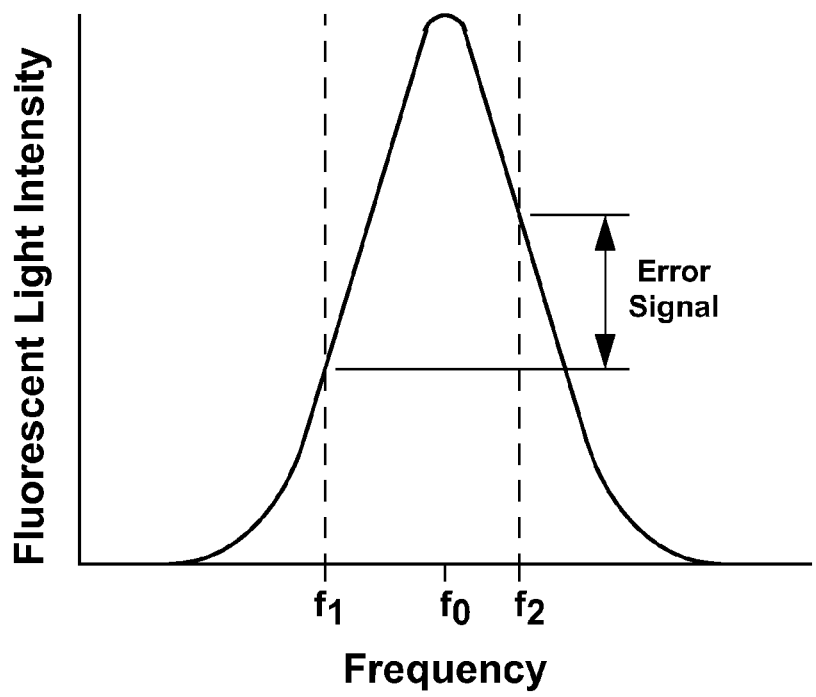

FIG. 3A shows the intensity of the fluorescent light 38 as a function of frequency for a resonance curve for the $|^2S_{1/2}, F=0, m_F=0>$ to $|^2S_{1/2}, F=1, m_F=0>$ transition, with the resonance curve being centered about the ground-state transition frequency $f_0$. Due to isolation of the Yb ions 22 in the octupole ion trap 16, the resonance curve is extremely narrow with a full-width at half-maximum (FWHM) of less than one Hertz.

With the frequency of the microwave source 32 periodically stepped (i.e. hopped) to hopping frequencies $f_1$ and $f_2$ on either side of the 12.6 GHz transition frequency $f_0$ using the frequency-stepping input 54, the difference in the electrical output signal 52 for the fluorescent light 38 generated at the two frequencies $f_1$ and $f_2$ can provide an error signal to the feedback control system 56. Each frequency $f_1$ and $f_2$ can be offset from the frequency $f_0$ by a few hundredths of one Hertz. The feedback control system 56, which can comprise a combination of analog and digital circuitry and can be controlled by a microprocessor or a computer, is used to tune and lock the microwave source 32 to the frequency $f_0$.

As shown in FIG. 3A, the error signal will be zero when the two hopping frequencies $f_1$ and $f_2$ are centered about the resonance curve as indicated by the vertical dashed lines in FIG. 3A since the intensity of the fluorescent light 38 will be the same at both frequencies $f_1$ and $f_2$. In this case, with the frequency-stepping input 54 turned off, the microwave source 32 will be centered exactly on the ground-state transition frequency $f_0$ and will provide a frequency output 58 for the ion clock 10 which can be divided using a plurality of frequency dividers (not shown) to provide an output, for example, of one pulse per second. The ion clock 10 can be used as a precise time and frequency standard with an estimated accuracy on the order of $10^{-12} \tau^{-0.5}$ where τ is the averaging time.

However, when the frequency of the microwave source 32 is not correctly centered at the frequency $f_0$, then the two hopping frequencies $f_1$ and $f_2$ will be offset on the resonance curve. In this case, a substantial error signal can be generated as shown in FIG. 3B, with the magnitude and polarity of the error signal providing feedback which can be used by the control system 56 to tune the microwave source 32 to the ground-state transition frequency $f_0$.

Figure 4:
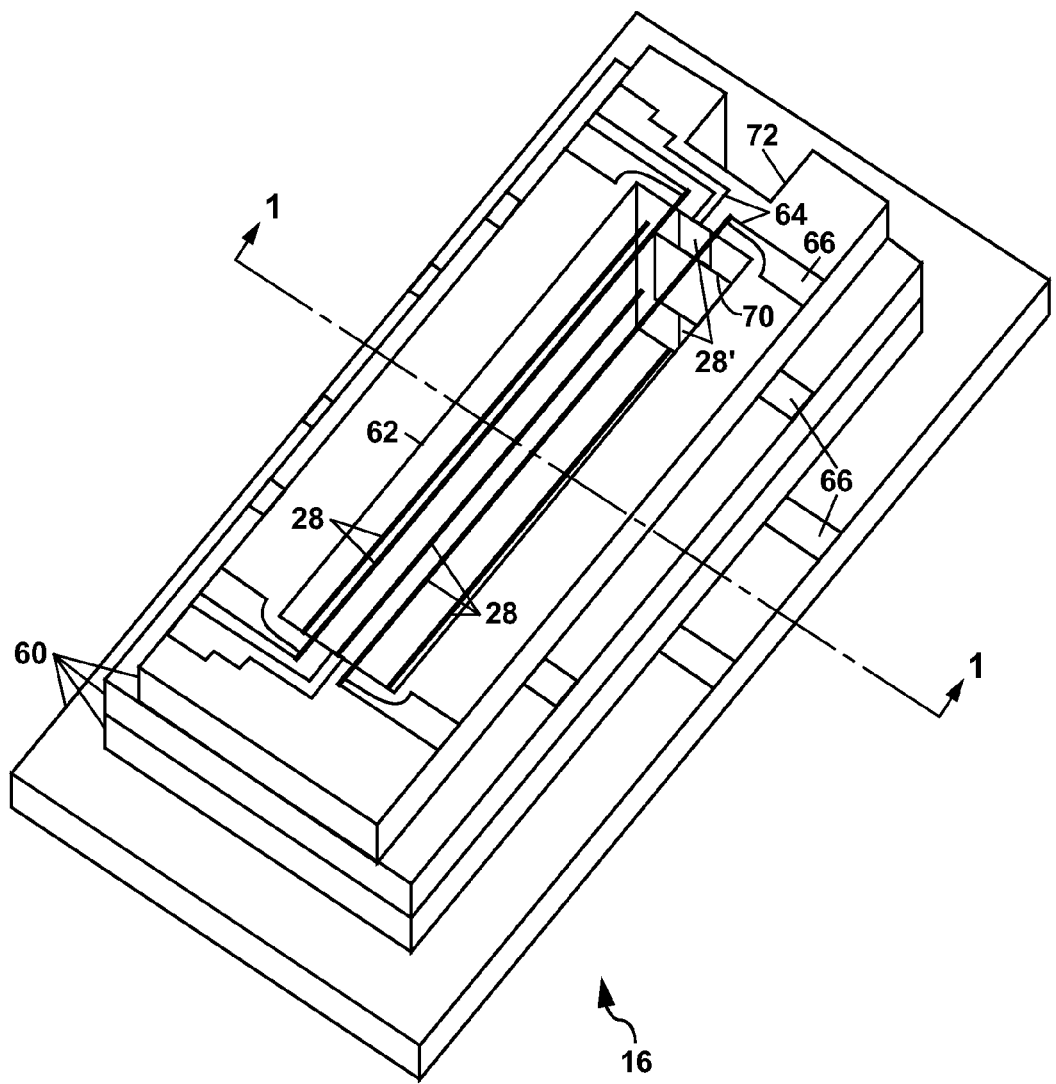
FIG. 4 shows a schematic perspective view of the octupole ion trap which is used to confine the Yb ions.
Figure 5:
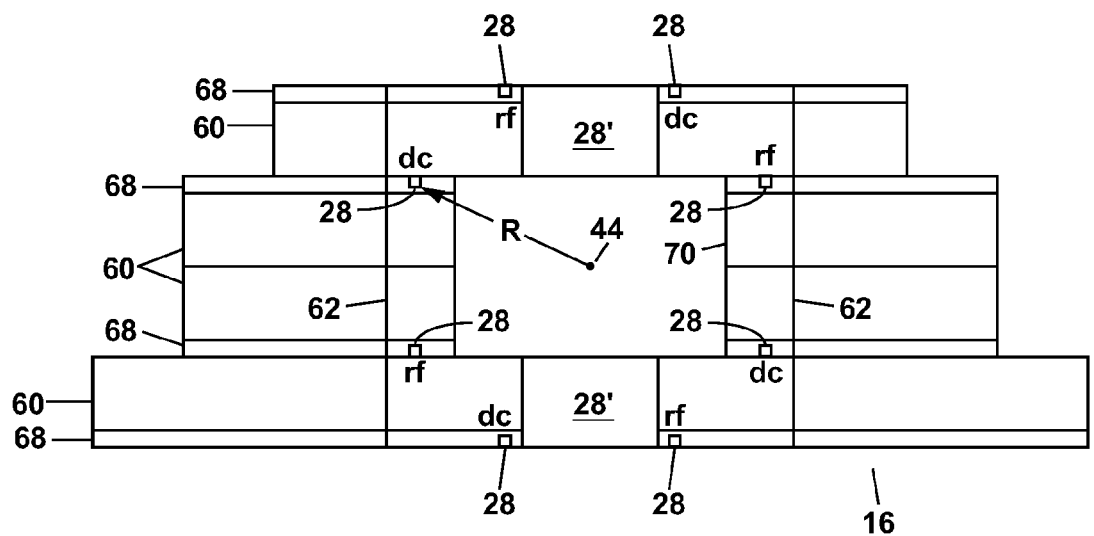
FIG. 5 is a schematic cross-section view of the octupole ion trap of FIG. 4 along the section line 1-1 in FIG. 4 to show the arrangement of the suspended electrodes and the rf and dc electrical signals which are applied to the suspended electrodes.

FIG. 4 shows a schematic perspective view of the octupole ion trap 16 which is used in the microfabricated ion frequency standard 10 of FIG. 1; and FIG. 5 shows a schematic cross-section view of the trap ion 16 along the section line 1-1 in FIG. 4 to show the arrangement of the electrodes 28 and 28' in the octupole ion trap 16. The ion trap 16 can be formed from four substrates 60 which are stacked up one upon the other, with each substrate 60 containing two electrodes 28 which are formed as suspended wires which extend lengthwise across an opening 62 through that substrate 60. Additional end-cap electrodes 28' are provided at each opposite ends of the opening 62 through the substrates 60. Wiring 64 and contact pads 66 are also provided on each substrate 60 to allow electrical connections to be made to the electrodes 28 and 28'.

The suspended electrodes 28 can be formed using a molded tungsten process wherein tungsten is deposited in a mold formed from one or more layers 68 of silicon dioxide or PETEOS. PETEOS is an acronym for a silicate glass which is formed from the thermal decomposition of tetraethyl orthosilicate, also termed TEOS, by a plasma-enhanced (PE) chemical vapor deposition (CVD) process. Each suspended electrode 28 can be formed, for example, by initially preparing a silicon substrate 60. This is done by forming a 1-μm-thick layer of a thermal oxide (not shown) over the silicon substrate 60 followed by a blanket deposition of a 1-2 μm thick layer 68 of PETEOS. A plurality of interconnecting trenches can be etched into the PETEOS layer 68 at the location where each suspended electrode 28 will be formed. This can be done using a photolithographically-defined etch mask and reactive ion etching. A layer of titanium nitride (TiN) can then be sputter-deposited over the silicon substrate 60 and in the interconnected trenches with the TiN layer being, for example, 20-50 nm thick. The TiN layer serves as an adhesion layer for the tungsten which can then be blanket deposited by CVD from tungsten hexafluoride ($WF_6$) at a temperature of about 400° C. The tungsten layer is tensile stressed and can be up to about 0.8 μm thick. After deposition of the tungsten layer, the tungsten and TiN outside of the opening in the PETEOS layer 68 can be removed by a chemical-mechanical polishing (CMP) step. Another layer 68 of PETEOS can then be blanket deposited over the silicon substrate 60 by PECVD and the above process steps repeated to build up the suspended electrodes 28 layer by layer as needed. The completed electrodes 28, which can have mesh structure resulting from the plurality of interconnected trenches, can have a cross-sectional width of, for example, 100 μm and a height of up to 10-20 μm. The length of the suspended electrodes 28 can be, for example, 1 centimeter (cm).

The electrodes 28, when built up as described herein, are surrounded by layers 68 of the PETEOS which is useful to reduce tensile stress in the suspended electrodes 28 during the build up of the electrodes 28. Upon removal of the PETEOS, the remaining tensile stress in the suspended electrodes 28 is useful to keep the electrodes 28 taut to provide a well-defined radially-symmetric electric field configuration in the octupole ion trap 16. Further details of the molded tungsten process can be found in U.S. Pat. No. 7,339,454 which is incorporated herein by reference.

After buildup of the suspended electrodes 28 and prior to removing the PETEOS, the wiring 64 and contact pads 66 can be deposited over a last-deposited PETEOS layer 68. The contact pads 66 can comprise aluminum with a layer thickness of up to a few hundred nanometers. The aluminum can also be deposited over the suspended electrodes 28 to provide an increased electrical conductivity. After deposition, the aluminum can be patterned by a reactive ion etching step.

The opening 62 can then be formed through each silicon substrate 60 from a bottom surface thereof which is opposite the PETEOS layer(s) 68. Additional openings 70 and 72 can also be formed at this time, with the opening 70, which can be formed through two of the four silicon substrates 60 providing access for the laser light 40 and the near-infrared light 46 (see FIG. 1); and with the opening 72, which can be formed through three of the silicon substrates 60 providing a location where a 45° turning mirror 74 can be located in the completed device 10 to direct the laser light 40 and the near-infrared light 46 into the octupole ion trap 16 along the axis 44. An additional opening (not shown) can be formed at an opposite end of the ion trap 16 from the opening 72 to form a light trap for the light 40 and 46.

The openings 62, 70 and 72 can be formed using an anisotropic etching process such as the well-known Bosch etching process which provides substantially vertical sidewalls for the etched openings 62, 70 and 72. The Bosch process is disclosed in U.S. Pat. No. 5,501,893 which is incorporated herein by reference. The openings 62, 70 and 72 can be anisotropically etched completely through the silicon substrate 60 using the Bosch process, with the etching being terminated upon reaching the thermal oxide layer.

The thermal oxide layer and the PETEOS layer 68 can then be removed at the locations of the openings 62, 70 and 72 using a selective wet etchant comprising hydrofluoric acid (HF) which etches away the thermal oxide and PETEOS but which does not substantially chemically attack the silicon substrate 60 or the tungsten electrodes 28. Areas of the substrate 60 outside of the openings 62, 70 and 72 can be masked off to prevent etching of the thermal oxide and PETEOS in these areas.

The end-cap electrodes 28' can then be deposited on the vertical sidewalls at opposite ends of the opening 62. This can be done using a shadow mask with the substrate 60 tilted at an angle of, for example, 45°. The end-cap electrodes 28', which can comprise aluminum or an aluminum alloy with a thickness in the range of 100-200 nm, can be deposited to slightly overlap the wiring 64 which is to be electrically connected to the end-cap electrodes 28'.

After fabrication of the four silicon substrates 60 as described above, the substrates 60 can be stacked up one upon the other as shown in FIGS. 4 and 5. The first two substrates 60 which are stacked up can be inverted so that the suspended electrodes 28 are located at the bottom of these substrates 60 as shown in FIG. 5. The remaining two silicon substrates 60 are then stacked up with the suspended electrodes 28 located on top of these two substrates 60. This arrangement allows the electrodes 28 to be located at a substantially equal radius R from the longitudinal axis 44 of the octupole ion trap 16. The radius R can be, for example, about 1-2 mm. The stacked up substrates 60 can be permanently bonded together using an epoxy which is suitable for use in vacuum. An electrically-conductive epoxy can also be used to make electrical connections between the various substrates 60, as needed. The completed octupole ion trap 16 can be, for example, 1.5 cm long>1 cm wide×2-4 mm high.

To operate the octupole ion trap 16, the rf and dc electrical signals are applied to the suspended electrodes 28 in an alternating arrangement as shown in FIG. 5, with additional dc electrical signals being applied to the end-cap electrodes 28'. The eight suspended electrodes 28 in the octupole ion trap 16 provide a radial confinement of the Yb ions 22 due to a generated rf electric field which is zero along the longitudinal axis 44, with the rf electric field increasing with radial distance out from the axis 44. The two end-cap electrodes 28' at each end of the octupole ion trap 16 provide an axial confinement of the Yb ions 22 by repelling the Yb ions 22. Computational modeling of the octupole ion trap 16 indicates that the ion trap 16 can provide a stable trapping of the Yb ions 22 with a trap depth of about 1.5 electron volts (eV) using rf electrical signals at a 2 MHz rf frequency with an amplitude of 75 Volts. The dc electrical signals can be up to a few tens of Volts.

With the Yb ions 22 confined in the trap volume 30 of the octupole ion trap 16, there is no need for shuttling (i.e. physically moving) the Yb ions 22 back and forth as is the case for certain other types of ion clocks which require that Hg ions be located at a first place for initialization of the ions using 194 nm light from a Hg discharge lamp to prepare the Hg ions in a lower level of a lower clock state (i.e. a lower hyperfine level of a ground state of the Hg ions), with the Hg ions then being transported (i.e. shuttled) by an electric field to a second place where a interrogation of the ions with 40.5 GHz microwave radiation takes place. This excites the Hg ions into an upper level of the lower clock state (i.e. an upper hyperfine level of the ground state of the Hg ions). The Hg ions are then shuttled back to the first place where the Hg ions are excited into an upper clock state (i.e. an excited-state level) using the 194 nm light from the Hg discharge lamp. This produces 194 nm emission from the Hg ions which is detected with a photomultiplier tube to determine the state of the Hg ions. This process of shuttling the Hg ions back and forth must be repeated as detailed above during each measurement cycle with these other types of ion clocks (see e.g. J. D. Prestage, et al., "Atomic Clocks and Oscillators for Deep-Space Navigation and Radio Science," *Proceedings of the IEEE*, vol. 95, pp. 2235-2247, November 2007). This need for shuttling of the Hg ions increases the size of this type of prior-art ion clock as compared to the ion clock 10 of the present invention; and it also requires additional circuitry for the shuttling of the Hg ions between two different types of ion traps which have very different characteristics for confining the Hg ions.

With the compact arrangement for the ion clock 10 of the present invention, which utilizes only a single ion trap 16 with an octupole electrode configuration, the various light sources 26, 42 and 48 can all be directed into the single trap volume 30 where the Yb ions 22 are confined, with the fluorescent light 38 also being collected from this same trap volume 30. This is a much simpler arrangement which reduces the size, weight and electrical power requirements for the ion clock 10 of the present invention.

Figure 6A:
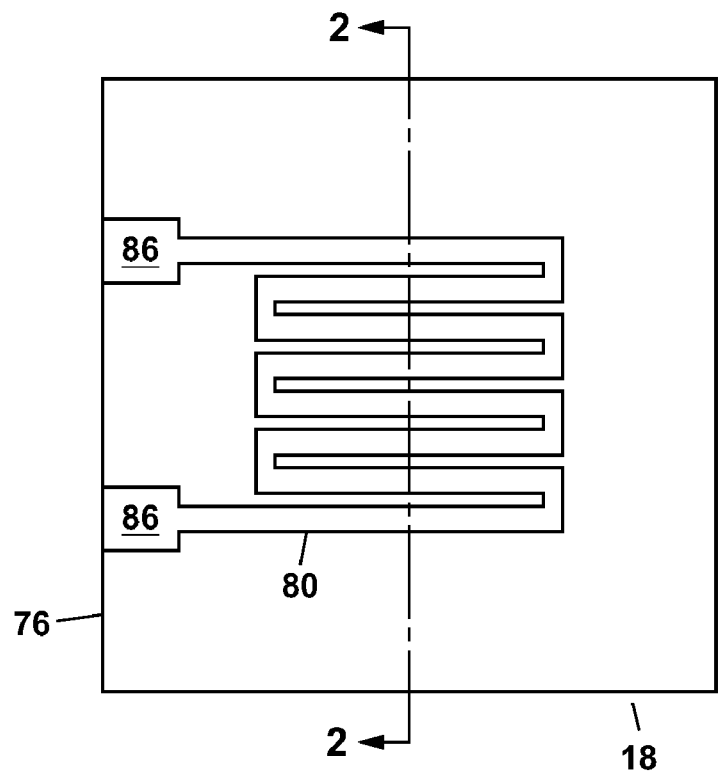
FIG. 6A shows a schematic plan view of a micro-hotplate which is used in the ion frequency standard of FIG. 1 to generate the cloud of Yb atoms.
Figure 6B:
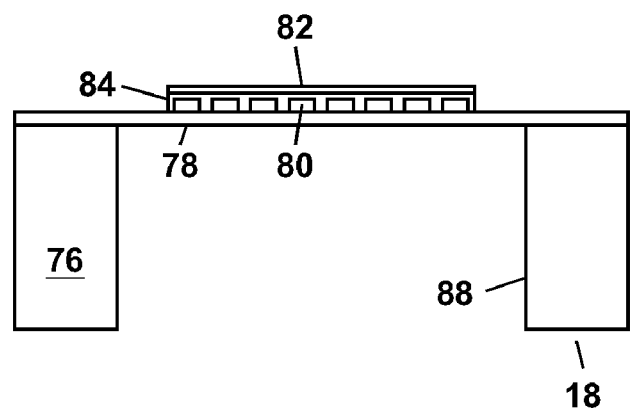
FIG. 6B is a schematic cross-section view of the micro-hotplate of FIG. 6A along the section line 2-2 in FIG. 6A.

Returning to FIG. 1, the micro-hotplate 18 in the example of FIG. 1 can be formed as illustrated in the schematic plan and cross-section views of FIGS. 6A and 6B, respectively. The schematic cross-section view of FIG. 6B is taken along section line 2-2 in FIG. 6A.

The micro-hotplate 18 comprises a substrate 76 on which a suspended membrane 78 is formed, with the suspended membrane 78 containing an electrical heating element 80 which can be formed from a refractory metal, a refractory metal silicide, or silicon carbide. The substrate 76 can comprise a semiconductor such as silicon, or a dielectric material such as glass, fused silica, or ceramic. The suspended membrane 78 can be formed from a layer of silicon nitride which is, for example, 1 μm thick with lateral dimensions on the order of 1 millimeter (mm) or less. The membrane 78 thermally isolates the heating element 80 from the substrate 76 to allow the heating element 80 to be rapidly heated to a temperature of several hundred degrees Celsius (e.g. 300-600° C.) using an electrical power on the order of 1 Watt or less. This heating for a period of a few seconds to a few tens of seconds generates the cloud of Yb atoms 20 from a layer 82 of ytterbium which is disposed over the heating element 80, with the Yb atoms 20 then being photoionized by the UV light 24 as described previously to generate the Yb ions 22. The Yb layer 82 can be up to about 1 µm thick and can comprise $^{171}$Yb. To electrically isolate the Yb layer 82 from the heating element 80, the heating element 80 can be encapsulated by an overlayer 84 of silicon nitride which can be, for example 0.5-1 µm thick. Electrical connections to the micro-hotplate 18 can be made via a pair of contact pads 86 which are connected to internal contact pads in the vacuum package 12 which are, in turn, connected to electrical feedthroughs through the walls of the vacuum package 12 and therefrom to an external power supply.

During prolonged operation of the ion frequency standard 10, the micro-hotplate 18 can be periodically operated, as needed, to replenish the Yb ions 22 which escape from the ion trap 16. The number of Yb ions 22 in the octupole ion trap 16 can be determined from the intensity of the detected fluorescent light 38 during operation of the ion clock 10. When the fluorescent light intensity drops below a predetermined level as determined by the electrical output signal 52 from the photodetector 50, the micro-hotplate 18 and the UV led 26 can be activated to replenish the Yb ions 22.

Fabrication of the micro-hotplate 18 can be performed by initially blanket depositing the silicon nitride layer over the substrate 76 by CVD; and then depositing an electrically-resistive material (e.g. Pt, Ti, W, Mo or a silicide thereof, or alternately SiC) for the electrical heating element 80 over the silicon nitride layer which will be used to form the suspended membrane 78, and then patterning the electrically-resistive material in a predetermined pattern (e.g. a serpentine pattern as shown in FIG. 6A) for the heating element 80. The contact pads 86 can also be formed at this time from the same electrically-resistive material as the heating element 80 and can be later optionally overcoated with a layer of aluminum or gold to facilitate wire bonding of lead wires that connect the micro-hotplate 18 to the internal contact pads in the vacuum package 12. The overlayer 84 of silicon nitride can then be deposited to encapsulate the heating element 80. An opening 88 through the substrate 76 can then be formed by wet or dry etching to remove the substrate material beneath the silicon nitride layer and thereby form the suspended membrane 78. This etching step can be performed using the Bosch etching process described previously, with the etching step being terminated upon reaching the silicon nitride layer which forms the suspended membrane 78. The Yb layer 82 can then be formed on the silicon nitride overlayer 84 by evaporation or sputtering through a shadow mask.

The completed micro-hotplate 18 can be inserted into the vacuum package 12 and attached thereto using an adhesive (e.g. epoxy). In some cases, a plurality of individual micro-hotplates 18 can be provided in the ion clock 10 as shown in FIG. 1. A plurality of micro-hotplates 18 can be provided as individual elements, or alternately as a micro-hotplate array which can comprise a plurality of micro-hotplates 18 arranged as an array on a common substrate. Each micro-hotplate 18 in the array can be individually addressed electrically. The micro-hotplate array can be fabricated by etching a plurality of openings 88 to form a plurality of suspended membranes 78 with each suspended membrane 78 having its own heating element 80, which can be independently addressed and electrically activated, and its own Yb layer 82. This arrangement is useful to provide a long-term source of Yb atoms 20 for generating the Yb ions 22 since micro-hotplates 18 in the array can be used one at a time until all the ytterbium on a particular micro-hotplate 18 is emitted; and then another micro-hotplate 18 in the array can be electrically addressed and used.

After inserting the micro-hotplate 18 into the LTCC housing 12, the micro-hotplate 18 can be attached to the LTCC housing 12 and electrically connected to the internal contact pads in the LTCC housing 12. The octupole ion trap 16 can then be inserted into the LTCC housing 12 and attached thereto. Electrical connections to the octupole ion trap 16 can be made between the contact pads 66 on the various stacked-up substrates 60 and internal contact pads in the LTCC housing 12 using a plurality of wire bonds. The internal contact pads are, in turn, electrically connected to electrical feedthroughs which extend through the walls of the LTCC housing 12 to allow external connections to be made to the octupole ion trap 16 and to the various other elements which are located inside the LTCC housing 12. The octupole ion trap 16 can contain the 45° turning mirror 74 which can be attached to the octupole ion trap 16 and optically aligned with the longitudinal axis 44 of the ion trap 16 prior to inserting the ion trap 16 into the LTCC housing 12.

A non-evaporable getter 90 as shown in FIG. 1 can also be attached to or deposited onto a surface of the ion trap 16 prior to inserting the ion trap 16 into the LTCC housing 12. The non-evaporable getter 90, is useful to maintain a high-purity atmosphere in the permanently-sealed vacuum package 12 since the non-evaporable getter 90 has a high pumping speed for atmospheric constituents but does not pump noble gases such as helium or neon which are used as a buffer gas in the ion clock 10. Non-evaporable getters are well-known in the art (see e.g. U.S. Pat. No. 6,521,014 which is incorporated herein by reference) and can be procured commercially.

The vacuum package 12 in FIG. 1 can also include a mirror 92 which collects the fluorescent light 38 and re-focuses the fluorescent light 38 back into the trap volume 30 and therefrom to the photodetector 50. This is useful to approximately double the amount of the fluorescent light 38 which is collected and detected by the photodetector 50. The mirror 92 can comprise a concave mirror or alternately a diffractive optical element which includes a reflective coating to form a diffractive mirror. In FIG. 1, the mirror 92 is shown as a diffractive mirror.

The mirror 92 can be formed integrally with the vacuum package 12, or attached to the outside of the vacuum package 12, or can be attached inside of the vacuum package 12 (e.g. attached to an inside wall of the vacuum package 12). In the example of FIG. 1, the mirror 92 is attached to the outside of the vacuum package 12. This can be done, for example, during cofiring of the LTCC housing 12. Alternately, the mirror 92 can be attached over an opening formed in an LTCC or metal housing 12 using a frit glass, or a braze or solder seal.

The vacuum package 12 can be baked out at a temperature above 200° C. in an ultra-high-vacuum environment prior to permanently sealing the vacuum package 12. Additional heating of the vacuum package 12 to a temperature of about 500° C. for up to a few minutes can be used to activate the getter 90. The vacuum package 12 can then be backfilled with a buffer gas such as helium or neon to a pressure of about $10^{-6}$ Torr immediately prior to permanently sealing the vacuum package 12. The buffer gas is useful to provide a collisional cooling of the Yb ions 22 after they have been formed and confined in the octupole ion trap 16.

The vacuum package 12 can then be permanently sealed to provide a hermetic environment for the Yb ions 22. This can be done, for example, by sealing the window 14 onto the vacuum package 12 using a solder seal. The window 14, which can comprise sapphire, can include an annular metallization to facilitate forming the solder seal to the vacuum package 12. Additionally, the window 14 can include an anti-reflection coating on one or both sides thereof. Sapphire is transparent at UV wavelengths and is well matched in terms of thermal expansion to low-temperature cofired ceramic (LTCC) materials which can be used to form the vacuum package 12. A completed LTCC housing 12 with attached sapphire window 14 and mirror 92 can made very compact, with dimensions of, for example, 1.7 cm×2 cm×0.8 cm.

In other embodiments of the present invention, the window 14 can be formed integrally with a wall of a LTCC housing 12 using LTCC fabrication techniques which are well-known in the art (see e.g. U.S. Pat. Nos. 6,384,473; 6,538,312 and 6,661,084 which are incorporated herein by reference).

The microwave source 32, which provides the microwave radiation 34 to excite the Yb ions 22 from the ground-state lower hyperfine level to the ground-state upper hyperfine level, can comprise an acoustic oscillator 94 which can use a resonant cavity or delay line to generate the microwave radiation 34. The acoustic oscillator 94 can comprise either an acoustic bandgap (ABG) oscillator, a microresonator oscillator or a film bulk acoustic wave (FBAR) oscillator. These types of acoustic oscillators 94 are compact and low power, and can provide a high quality factor (Q) of up to $10^3$ for FBAR oscillators and up to $10^4$ in the case of ABG oscillators. Each type of acoustic oscillator 94 above can be temperature stabilized in an oven or with an electrical heater to maintain a relatively high fractional frequency stability for the ion clock 10. Temperature tuning can also be used to provide a gross frequency tuning of each type of acoustic oscillator 94. Each acoustic oscillator 94 can also be fine tuned over a limited range as will be described hereinafter.

An FBAR oscillator can be formed from electrodes which are sandwiched about a thin layer of a piezoelectric material such as aluminum nitride (AlN), zinc oxide (ZnO) or lead zirconate titanate (PZT) with the frequency of the oscillator being determined by the layer thickness of the piezoelectric material. The FBAR oscillator can be acoustically isolated by suspending the FBAR oscillator over a substrate. Alternately, the FBAR oscillator can be acoustically isolated using a plurality of one-quarter-wavelength acoustic reflection layers which are oriented either vertically or horizontally.

FBAR oscillators are well-known in the art and need not be described herein in detail (see e.g. W. Pan, et al., "A Surface Micromachined Electrostatically Tunable Film Bulk Acoustic Resonator," Sensors and Actuators A, vol. 126, pp. 436-446 (2006), and U.S. Pat. Nos. 7,372,346 and 7,385,334 which are incorporated herein by reference).

Typical frequencies for currently-available FBAR oscillators are up to about 7 GHz. Frequency doubling of the output frequency of an FBAR oscillator operating at 6.3 GHz can be used to generate the 12.6 GHz frequency required for operation of the ion clock 10. Alternately, higher frequency multiplication factors can be used with an FBAR oscillator operating at a lower frequency to achieve the 12.6 GHz frequency required for the microwave source 32. The FBAR oscillator can be located in a temperature-stabilized oven with the frequency of the FBAR oscillator being initially temperature tuned over a range of a few tens of kiloHertz (kHz) to acquire the electrical output signal 52 from detecting the fluorescent light 38. The FBAR oscillator can then be fine tuned over a narrow range of ±1 Hz or less during each subsequent interrogation of the Yb ions 22 (i.e. during the interrogation time $T_R$). This can be done, for example, by using one or more capacitors that can be switched into or out of circuit with the FBAR oscillator (see e.g. U.S. Pat. No. 7,372,346). Switching of these capacitors can be performed using the frequency stepping input 54.

A microresonator oscillator operates much like an FBAR oscillator, only in a lateral mode. To obtain oscillation at a high frequency of several GHz or more, the microresonator oscillator can operate in a width extensional mode. The microresonator oscillator can be formed as an elongate piezoelectric plate (e.g. comprising AlN, ZnO or PZT) which is suspended above a substrate with opposite ends of the piezoelectric plate being connected to the substrate (e.g. through tethers, or through the plate itself). A pair of interdigitated electrodes can be formed on an upper surface of the piezoelectric plate to electrically stimulate the piezoelectric plate to oscillate at a frequency which is determined by a spacing of the interdigitated electrodes, with the spacing generally being substantially equal to one-half of an acoustic wavelength for the piezoelectric material forming the microresonator oscillator. When, the piezoelectric plate is formed from AlN, the piezoelectric plate can be, for example, 0.5-1 µm thick with an active area wherein the interdigitated electrodes are located being, for example, 20-200 µm wide and a 50-200 µm long.

Figure 7A:
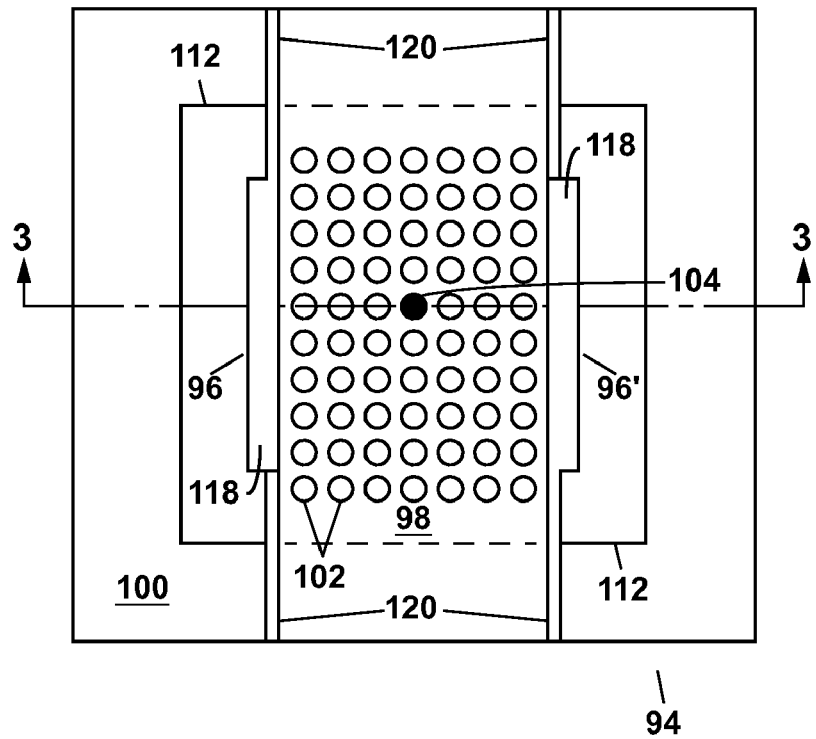
FIG. 7A shows a schematic plan view of a acoustic bandgap (ABG) oscillator which can be used to form the microwave source for the ion frequency standard of the present invention.
Figure 7B:
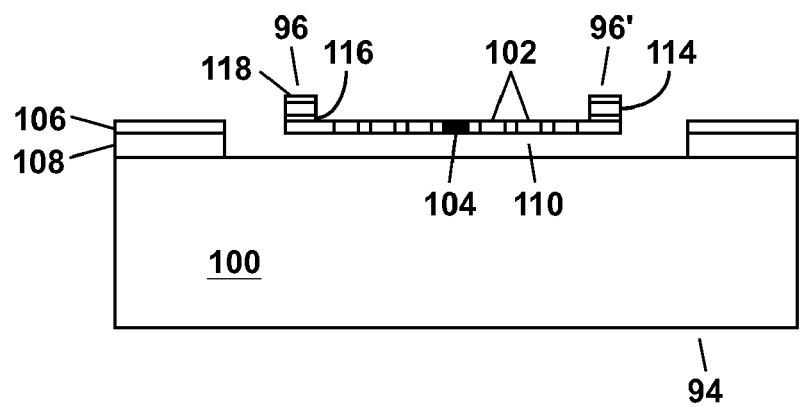
FIG. 7B is a schematic cross-section of the ABG oscillator of FIG. 7A along the section line 3-3 in FIG. 7A.

An ABG oscillator can also be used to form the microwave source 32. FIG. 7A shows a schematic plan view of an example of an ABG oscillator which can be used for the acoustic oscillator 94; and FIG. 7B shows a schematic cross-section view of the ABG oscillator of FIG. 7A along the section line 3-3 in FIG. 7A.

The ABG oscillator 94 comprises a pair of piezoelectric transducers 96 and 96' which are located on a membrane 98 which is suspended above a substrate 100, with the membrane 98 including a plurality of periodic scatterers 102 which are arranged as a two-dimensional array (i.e. a phononic lattice) and embedded in the membrane 98 between the transducers 96 and 96'. The piezoelectric transducer 96, when electrically activated, generates an acoustic wave which is directed through the membrane 98 from the transducer 96 to the transducer 96' in the absence of the scatterers 102. The acoustic wave upon reaching the transducer 96' generates an electrical output signal at the frequency of the acoustic wave.

However, with the scatterers 102 in place in the membrane 98, the transmission of the acoustic wave is blocked. This results from the scatterers 102, which have a density and/or an elastic constant different from that of the membrane 98 and a spacing (i.e. a period) which is comparable to the wavelength of the acoustic wave, producing a destructive interference of the acoustic wave which reflects the acoustic wave back towards the transducer 96 rather than being coupled through the membrane 98 to the transducer 96'. This destructive interference produces the acoustic bandgap in the ABG oscillator 94.

The inclusion of one or more defects 104 in the membrane 98 can modify the acoustic bandgap, thereby forming a filter or delay line which transmits a specific frequency of oscillation across the membrane 98, or a high-Q cavity which is resonant at a specific frequency. This is schematically illustrated in FIG. 7A with a single defect 104 inserted among the scatterers 102, with the defect 104 having a density, size or elastic constant which is different from that of the scatterers 102. A plurality of defects 104 can also be located in the ABG oscillator 94 and arranged in a line to replace one or more rows or columns of the scatterers 102. In some cases, the defects 104 can be formed by simply omitting one or more of the scatterers 102, with each omitted scatterer 102 becoming, in effect, a defect 104. The difference in characteristics between one or more defects 104 and the scatterers 102 breaks the periodicity of the phononic lattice to allow the transmission of a particular frequency between the transducers 96 and 96'.

The ABG oscillator 94 of FIGS. 7A and 7B can be formed, for example, on a silicon-on-insulator substrate 100 which comprises a monocrystalline silicon layer 106 and a silicon dioxide layer 108, with a portion of the silicon dioxide layer 108, which acts as a sacrificial material, being etched away to form an open area 110 beneath the monocrystalline silicon layer 106 which forms the membrane 98. The monocrystalline silicon layer 106 can be, for example, about 1 μm thick with the silicon dioxide layer 108 being, for example, 2 μm thick. The exact thickness of the monocrystalline silicon layer 106 will depend upon the frequency of the ABG oscillator 94.

In FIG. 7A, the open area 110 beneath the membrane 98 is located between a pair of openings 112 through the membrane 98 and between the two dashed lines which indicate the extent of the open area 110 beneath the membrane 98. The scatterers 102 can comprise, for example, tungsten which is deposited into circular openings which are reactive ion etched through the monocrystalline silicon layer 106 prior to etching the silicon dioxide layer 108 with a selective etchant comprising liquid or gaseous HF to form the open area 110. The openings 112 provided on either side of the membrane 98 expose the underlying silicon dioxide layer 108 to aid in removing the silicon dioxide with the HF etchant.

By electrically connecting the transducer 96' back to the transducer 96 through an external feedback loop which includes an amplifier to provide gain, oscillation can be produced in the ABG oscillator 94 at a predetermined frequency. The diameter of the scatterers 102 can be, for example, about 1-1.5 μm with a period of about 4 μm to provide oscillation at a frequency near 788 MHz. The 788 MHz frequency from the ABG oscillator 94 can then be multiplied in frequency by a factor of 16 using a frequency multiplier to generate the 12.6 GHz frequency needed for the microwave oscillator 32. Alternately, state-of-the-art lithography may allow fabrication of the ABG oscillator 94 to oscillate directly at the 12.6 GHz frequency. Frequency tuning of the ABG oscillator 94 can be over about the same range as for the FBAR oscillator. This can be done, for example, by using temperature tuning over a range of a few tens of kHz to initially acquire the electrical output signal 52 due to the detected fluorescent light 38, and then providing fine tuning over a range of ±1 Hz using one or more capacitors that can be switched into or out of circuit with the ABG oscillator 94. Switching of the capacitors can be performed using the frequency stepping input 54 to hop the frequency of the ABG oscillator 94 to generate the error signal which can be used to tune the microwave radiation 34 to be coincident with the 12.6 GHz ground-state transition frequency $f_0$ of the Yb ions 22.

Although the example of the ABG oscillator 94 in FIGS. 7A and 7B shows the scatterers 102 with a circular shape in plan view and arranged in a square lattice, those skilled in the art will understand that other shapes and lattice arrangements for the scatterers 102 can be used including shapes which are polygonal and lattice arrangements which are triangular, hexagonal, or honeycomb-shaped. Other materials can also be used for the scatterers 102 in forming the ABG oscillator 94, including tungsten carbide, platinum, molybdenum, and polycrystalline diamond. In other embodiments of the present invention, silicon dioxide or a silicate glass such as PETEOS can be used to form the membrane 98 with monocrystalline silicon or polycrystalline silicon being used as a sacrificial material beneath the membrane 98. When monocrystalline or polycrystalline silicon is used as the sacrificial material beneath the membrane 98, the silicon sacrificial material can be removed using dry $SF_6$ as a selective etchant.

The transducers 96 and 96' in the ABG oscillator 94 in FIGS. 7A and 7B can comprise a thin layer of a piezoelectric material 114 such as AlN, ZnO or PZT which can be on the order of 0.5-1 μm thick. The piezoelectric material 114 can be deposited or grown over a lower electrode 116 which is first deposited on the membrane 98 and patterned by reactive ion etching. An upper electrode 118 can then be formed over the piezoelectric material and patterned by reactive ion etching. During formation of the electrodes 116 and 118, electrical wiring 120 can also be formed for coupling electrical signals into and out of the transducers 96 and 96'. The electrodes 116 and 118 and the wiring 120 can comprise, for example, aluminum deposited by evaporation or sputtering over titanium/titanium nitride adhesion layers, with the aluminum being, for example, 100-400 nm thick.

Further details on the fabrication of phononic crystal devices (also termed acoustic bandgap devices) can be found in the following articles: R. H. Olsson III, et al., "Microfabricated VHF Acoustic Crystals and Waveguides," *Sensors and Actuators A*, vol. 145-146, pp. 87-93 (2008) and R. H. Olsson III, et al., "Microfabricated Phononic Crystal Devices and Applications," *Journal of Measurement Science and Technology*, vol. 20, (2009) 012002 which are incorporated herein by reference.

Returning to FIG. 1, the various light sources 26, 42 and 48 and the photodetector 50 can be located in a separate housing which is referred to herein as an optics package 122. The optics package 122 can be, for example, 1.2 cm wide and 1.7 cm long and 0.5 cm high. The optics package 122 can comprise a common substrate 124 on which the UV LED 26, the frequency-doubled VCSEL 42, the near-infrared LED 48 and the photodetector 50 are located. This substrate 124 can be formed of silicon or ceramic (e.g. LTCC) with a plurality of metal traces for making electrical connections to the light sources 26, 42 and 48 and the photodetector 50. The metal traces can be connected to electrical vias formed through the substrate 124 to allow external electrical connections to be made to the light sources 26, 42 and 48 and the photodetector 50. The wavelength and intensity of the light from the various light sources 26, 42 and 48 can be stabilized by controlling the electrical current and/or temperature for each light source using circuitry which can be provided on the substrate 124 or located externally.

The optics package 122 can also comprise one or more lenses which can be formed as conventional lenses 126 or as diffractive lenses 126' (i.e. diffractive optical elements which focus or redirect light which is transmitted through the diffractive optical elements). The diffractive lenses 126' in the example of FIG. 1 are used to direct the light 24 from the UV LED 26 into the trap volume 30 to produce the Yb ions 22 by photoionization, and are also used to collect the fluorescent light 38 and direct this light 38 to the photodetector 50. The conventional lenses 126 in FIG. 1 are used to collimate the laser light 40 from the frequency-doubled VECSEL 42 and the near-infrared light 46 from the near-infrared LED 48.

Diffractive optical elements such as the diffractive mirror 92 described previously and the diffractive lenses 126' described here are advantageous since they can provide a large solid angle with a numerical aperture (NA) of about 0.5-1 for collection of the fluorescent light 38 while being relatively thin (e.g. a thickness of 1-3 mm). Additionally, diffractive optical elements can be tailored to direct light in an off-axis direction as shown for the UV light 24 in FIG. 1.

In FIG. 1, the near-infrared light 46 and the laser light 40 are combined together using a pair of beamsplitters 128 including a dichroic beamsplitter which transmits the laser light 40 and reflects the near-infrared light 46. In this way, both the near-infrared light 46 and the laser light 40 can be directed into the trap volume 30 along the longitudinal axis 44.

The diffractive lenses 126' can be formed in a transparent substrate 130 comprising, for example, fused silica. This can be done by etching a predetermined diffractive lens profile into the transparent substrate 130. Stepped openings 132 can also be formed by etching through the transparent substrate 130. These stepped openings 132 are useful for locating and attaching the conventional lenses 126 and beamsplitters 128 to the transparent substrate 130. The lenses 126 and beamsplitters 128 can be attached to the substrate 130, for example, with an adhesive such as an optical cement or a UV-cured epoxy.

Annular spacers 134 can be used for spacing the substrates 124 and 130 apart from each other and from the sapphire window 14. These spacers 134 can be formed, for example, from ceramic and can be attached to the substrates 124, 130 and to the sapphire window 14 using an epoxy.

The UV LED 26 and the near-infrared LED 48 can be procured commercially in chip form and attached to the substrate 124. The photodetector 50, which is responsive to detect the UV fluorescent light 38 can also be procured commercially in chip form and attached to the substrate 124. The photodetector 50 can be either a UV-enhanced photodetector, or an avalanche photodetector having a peak sensitivity near 400 nm (see e.g. U.S. Pat. No. 5,596,186 which is incorporated herein by reference). The photodetector 50 can include an optical filter to block the transmission of light at wavelengths other than 369 nm.

Figure 8:
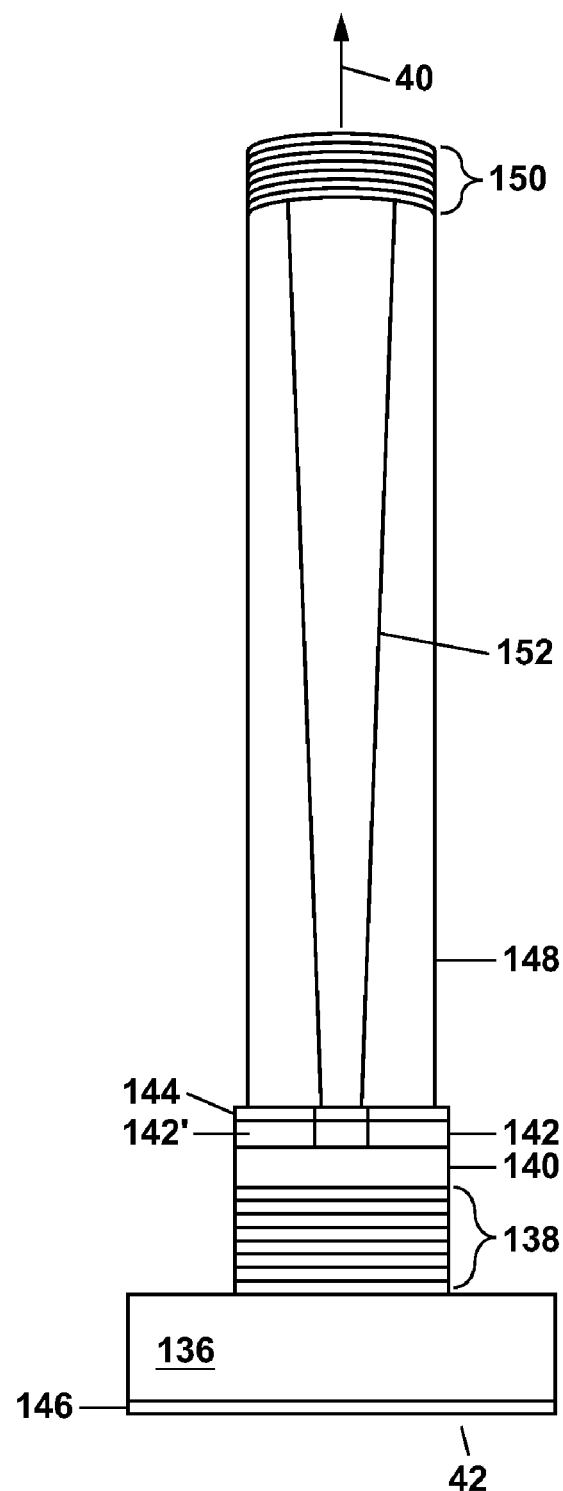
FIG. 8 shows a schematic plan view of the frequency-doubled vertical-external-cavity surface-emitting laser (VECSEL) which is used to generate the 369-nm laser light in the ion frequency standard of the present invention.

The frequency-doubled VECSEL 42, which is schematically illustrated in FIG. 8, comprises a gallium arsenide (GaAs) substrate 136 on which a plurality of III-V compound semiconductor layers are epitaxially grown by metal-organic chemical vapor deposition (MOCVD) or by molecular beam epitaxy (MBE). The plurality of III-V compound semiconductor layers form a distributed-Bragg-reflector (DBR) mirror 138, a quantum-well active region 140 and a current-confinement region 142. The DBR mirror 138 comprises a plurality of alternating layers of aluminum arsenide (AlAs) and aluminum gallium arsenide (AlGaAs) which each have an effective optical thickness of one-quarter wavelength to provide a high reflectivity of greater than 99% and preferably greater than 99.5% at a wavelength of 739 nm. The total number of periods of the DBR mirror 138 can be in the range of about 25-40, with each period consisting of one AlAs layer and one AlGaAs layer. The quantum-well active region 140 can comprise one or more quantum wells formed from AlGaAs to provide gain for lasing at 739 nm.

The current-confinement region 142 is provided above the active region 140 to control the flow of an electrical current from an annular upper contact 144 through the active region 140 to a lower contact 146 which can be formed on the GaAs substrate 136. The current-confinement region 142 increases the current density in a central portion of the active region 140; and this increases the optical gain for lasing in the active region 140. The current-confinement region 142 can comprise a relatively small number of periods (i.e. $\leq 10$) of alternating AlAs and AlGaAs layers, with each AlAs and AlGaAs layer having an effective optical thickness of one-quarter wavelength at 739 nm. The current-confinement region 142 can be doped for electrical conductivity during epitaxial growth with a doping type which is opposite the doping type of the GaAs substrate 136 and the DBR mirror 138 (i.e. the current-confinement region 142 is p-type doped when the substrate 136 and mirror 138 are n-type doped; and the current-confinement region 142 is n-type doped when the substrate 136 and mirror 138 are p-type doped). The current-confinement region 142 can also include a heavily-doped (e.g. about $10^{19}$ cm$^{-3}$) cap layer (e.g. comprising GaAs) immediately below the upper contact 144 to facilitate electrically contacting the current-confinement region 142.

An annular portion 142' of the current-confinement region 142 can be implanted with protons (i.e. hydrogen ions) or with oxygen ions after epitaxial growth to increase the electrical resistance of this annular portion 142' and thereby confine the electrical current flow to a central portion of the current-confinement region 142. Alternately, a selective oxidation process can be used to oxidize the annular portion 142' of the current-confinement region 142 in a moist environment at an elevated temperature. The selective oxidation of AlAs and AlGaAs layers is well known in the art and need not be described herein in detail (see e.g. U.S. Pat. No. 5,493,577 which is incorporated herein by reference).

A frequency-doubling crystal 148 is provided in the frequency-doubling VECSEL 42 adjacent to the active region 140, with a resonant cavity being formed about the frequency-doubling crystal 148 and the active region 140 by the DBR mirror 138 and by a dichroic mirror 150 which can be deposited onto an output side of the frequency-doubling crystal 148 opposite the DBR mirror 138. The frequency-doubling crystal 148 can comprise a periodically-poled lithium tantalate (PPLT) nonlinear crystal with a length of, for example, about 5 mm and a thickness of, for example, 0.2 mm. This nonlinear crystal 148 can be periodically poled to provide a second-order quasi-phase-matching period of 4.6 µm, or a first-order quasi-phase-matching period of 2.3 µm. The periodic poling (i.e. periodic reversal of the ferroelectric domains) of the lithium tantalate nonlinear crystal 148 can be performed using an electric field poling process which is well-known in the art (see e.g. L. E. Myers et al., "Quasi-Phase-Matched Optical Parametric Oscillators in Bulk Periodically Poled LiNbO$_3$," *Journal of the Optical Society B*, vol. 12, pp. 2102-2116, November 1995, which is incorporated herein by reference).

The output side of the PPLT crystal 148 can be polished to provide a radius of curvature of about 5 mm for the dichroic mirror 150. The dichroic mirror 150 can be a multi-layer dielectric mirror with a reflectivity of light at 739 nm which can be $\geq 99.5\%$. This high reflectivity for the two mirrors 138 and 150 provides a high finesse for the 739 nm lasing within the resonant cavity thereby allowing the build-up of a circulating lasing beam 152 with a relatively high optical power level. The reflectivity of the dichroic mirror 150 at 369 nm on the other hand can be relatively low to allow the 369 nm wavelength of the lasing light 40 generated by the PPLT crystal 148 to be emitted from the output side of the PPLT crystal 148. An anti-reflection coating can also be provided on an input side of the PPLT crystal 148, which is proximate to the active region 140, to reduce the reflection of the 739-nm lasing beam 152 at the input side of the PPLT crystal 148. The 369-nm laser light 40 generated by the frequency-doubled VECSEL 42 can be up to a few tens of microWatts (µW) which is sufficient for operation of the ion frequency standard 10.

The completed frequency-doubled VECSEL 42 can be mounted on edge on the substrate 124 in FIG. 1, with a 45° turning mirror 154 being used to direct the laser light 40 in a vertical direction substantially perpendicular to the plane of the substrate 124. Additional details for the fabrication of the frequency-doubled VCSEL 42 can be found in U.S. Pat. No. 6,393,038 which is incorporated herein by reference.

Figure 9:
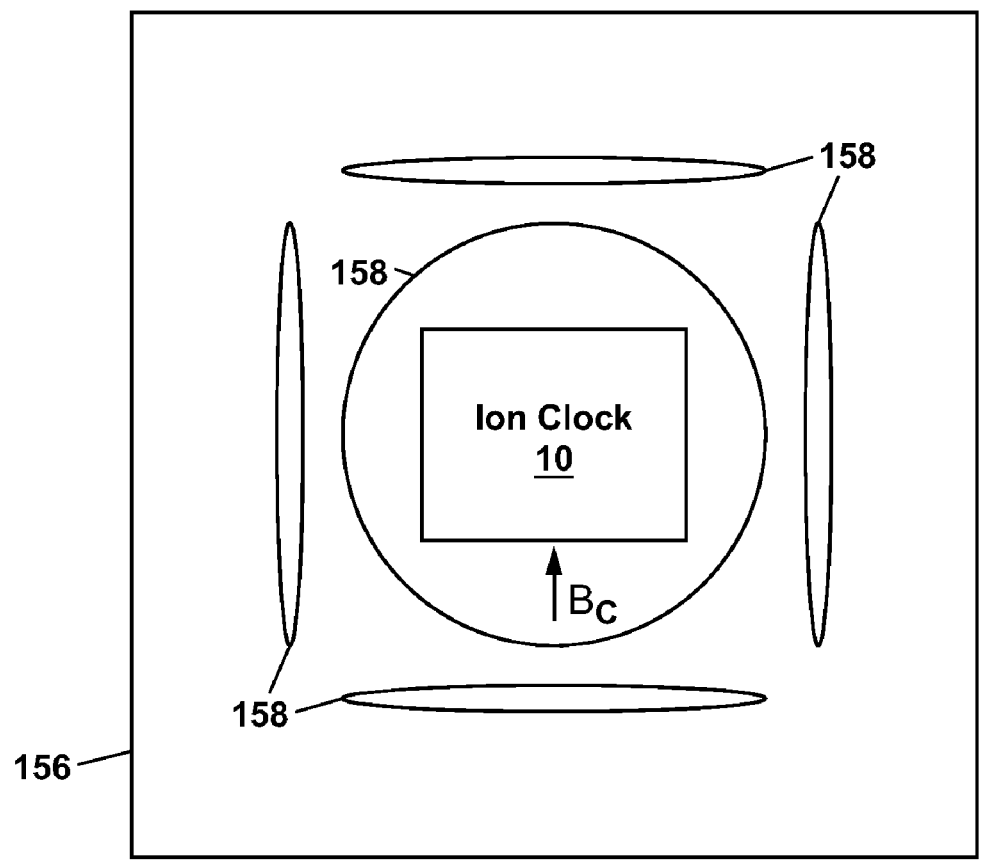
FIG. 9 schematically illustrates the ion frequency standard (also referred to herein as an ion clock) located within a magnetic shield with a plurality of magnetic coils being located about the ion frequency standard to cancel out any background magnetic field which penetrates through the magnetic shield and with one pair of the magnetic coils generating a C-field which extends into the trap volume of the ion frequency standard to provide a Zeeman splitting of the ground-state upper hyperfine level as shown in FIG. 2.

The microfabricated ion frequency standard 10 in the example of FIG. 1 can be located within a magnetic shield 156 as shown in FIG. 9 with a plurality of sets of magnetic coils 158 being located about the ion clock 10 to cancel out any background magnetic fields (e.g. due to the earth's magnetic field) which penetrate through the magnetic shield 156. One set of the magnetic coils 158 can be used to provide a magnetic field (termed a C-field) of about one-half Gauss. The C-field, which extends into the trap volume 30, is oriented to provide a Zeeman splitting of the ground-state upper hyperfine level of the Yb ions 22 as shown in FIG. 2. With the C-field splitting the Yb ion ground-state upper hyperfine levels as shown in FIG. 2, only the F=1, $m_F$=0 ground-state upper hyperfine level will be excited by the microwave radiation 34 at 12.6 GHz.

Figure 10:
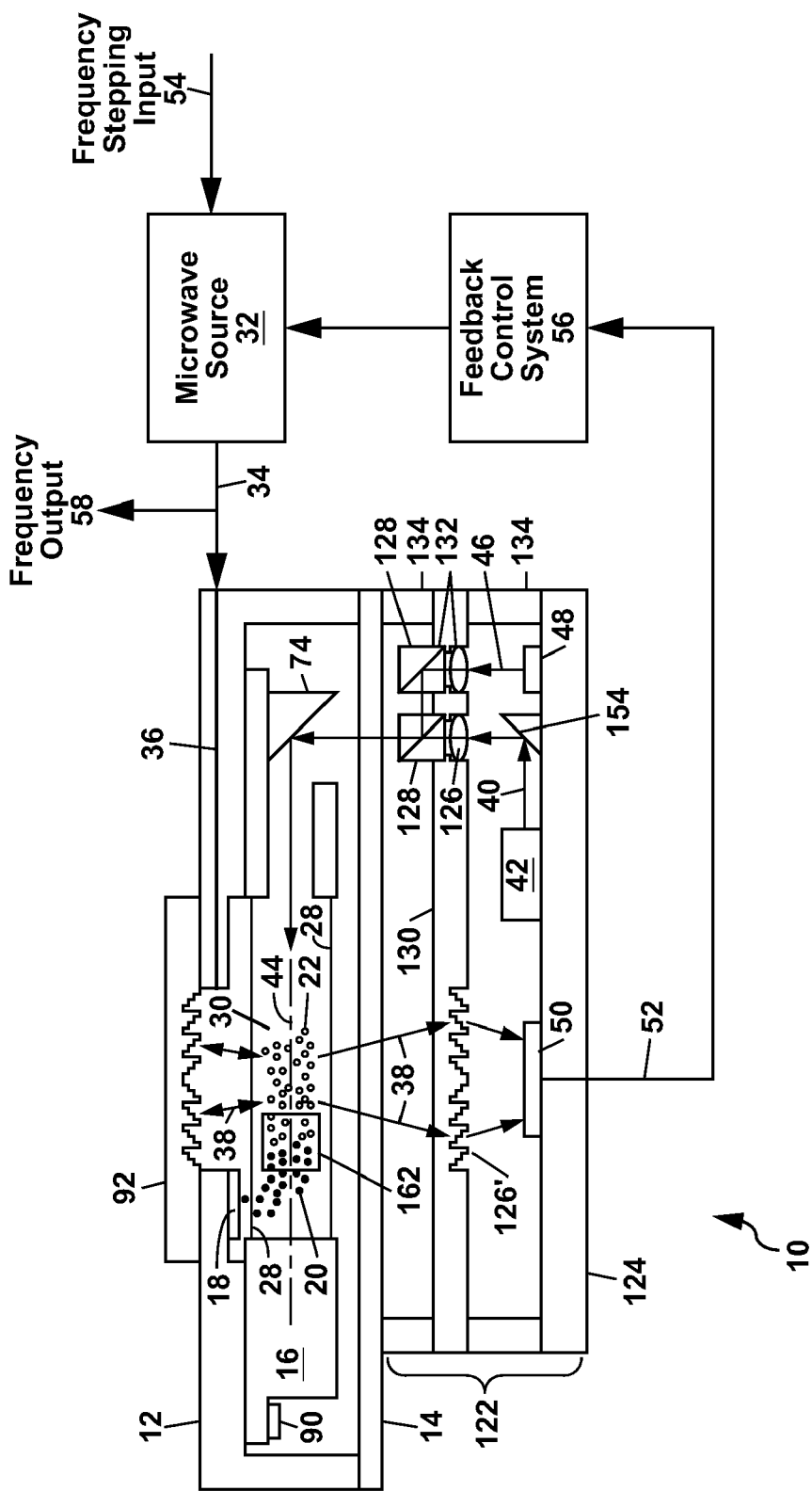
FIG. 10 schematically illustrates a second example of the ion frequency standard of the present invention.

FIG. 10 schematically illustrates a second example of the microfabricated ion frequency standard 10 of the present invention. During operation, the ion frequency standard 10 of FIG. 10 can be located within the magnetic shield 156 and the magnetic coils 158 as shown in FIG. 9. This second example of the ion frequency standard 10 substitutes a field-emission electron source 162 for the UV LED 26 to ionize the Yb atoms 20 and thereby produce the Yb ions 22. The field-emission electron source 162 can be located within the permanently-sealed vacuum package 12 proximate to the micro-hotplate 18. In the example of FIG. 10, the field-emission source 162 is shown located on a sidewall of the permanently-sealed vacuum package 12 although those skilled in the art will understand that other locations for the electron source 162 are possible, and that, in some instances, multiple field-emission electron sources 162 can be provided in the ion frequency standard 10 (e.g. when multiple micro-hotplates 18 are utilized). The field-emission source 162 only needs to be operated for a short period of time on the order of a few seconds or less to generate the Yb ions 22 from the cloud of Yb atoms 20 emitted by the micro-hotplate 18.

Figure 11A:
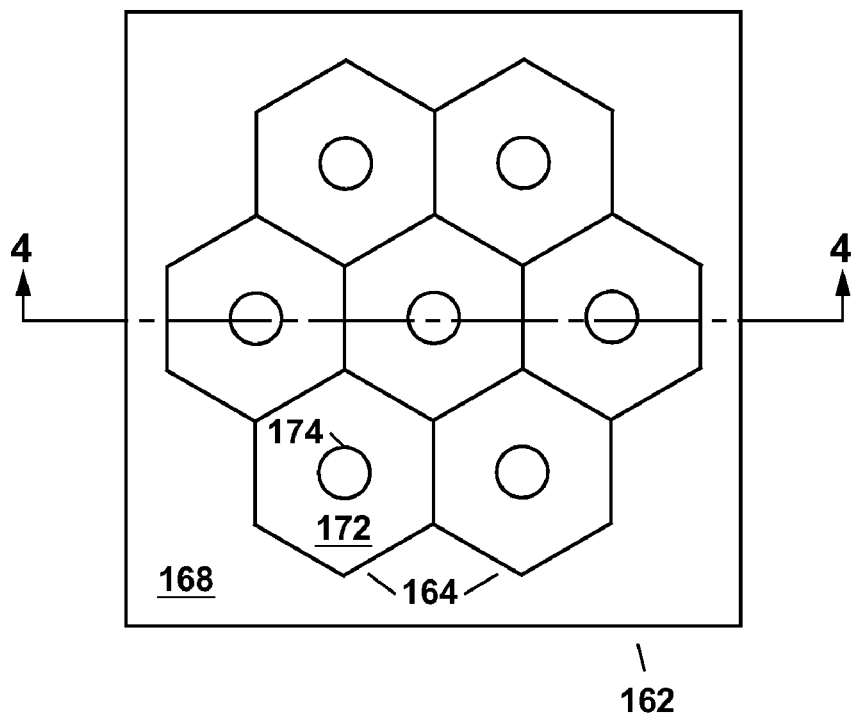
FIG. 11A shows a schematic plan view of a field-emission electron source which is used in the ion frequency standard of FIG. 10 to generate the Yb ions.
Figure 11B:
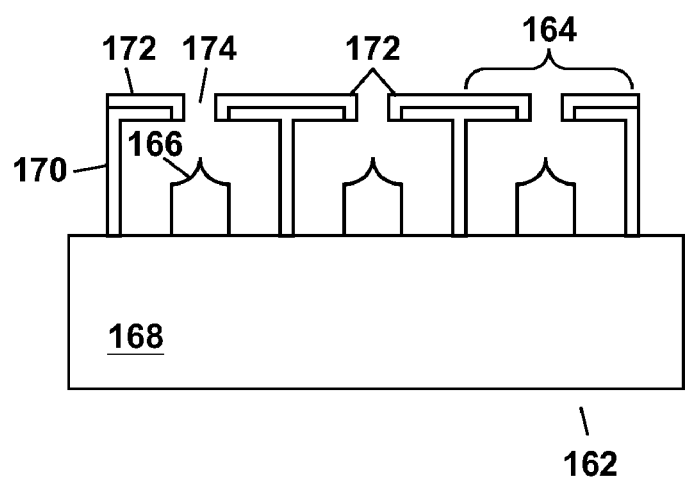
FIG. 11B is a schematic cross-section view of the field-emission electron source of FIG. 11A along the section line 4-4 in FIG. 11A.

The field-emission source 162, which can be formed by conventional micromachining processes, comprises a plurality of electron micro-emitters 164 which can be arranged in an array as shown in the schematic plan view of FIG. 11A and in the schematic cross-section view of FIG. 11B which is taken along the section line 4-4 in FIG. 11A. The shape of each micro-emitter 164 can be circular or polygonal; and the array can be either one-dimensional or two-dimensional. Although only a small number of micro-emitters 164 are shown in FIG. 11A for clarity, the field-emission source 162 can have up to one hundred or more individual micro-emitters 164, with each micro-emitter 164 having lateral dimensions of, for example, about 10 μm and a height of about 10 μm or less.

Each micro-emitter 164 includes a micro-emitter tip 166 which can be formed of silicon and which emits electrons through field emission. Each micro-emitter tip 166 can be formed as a post with a pointed tip by etching a silicon substrate 168 using a photolithographically-defined etch mask (not shown). A support structure 170 can be formed about each micro-emitter tip 166 from one or more layers of silicon nitride which are deposited and etched (e.g. by reactive ion etching). The support structure 170 can be up to a few microns high. Silicon dioxide or TEOS can be used as a sacrificial material during buildup of the support structure 170 and an overlying layer of tungsten which can be, for example, 1-2 μm thick. The sacrificial material then can be removed by a selective wet etchant (e.g. comprising HF) to form the completed field-emission source 162 of FIGS. 11A and 11B.

The layer of tungsten forms a gate 172 which is used to generate a high electric field of up to a few tens of megaVolts per centimeter (MV-cm$^{-1}$) when a voltage of up to about 200 Volts is applied between the gate 172 and the substrate 168 which can be electrically grounded. This high electric field produces a tunneling of electrons from the micro-emitter tip 166, with the electrons being emitted through an opening 174 in each electron micro-emitter 164. The electrons can then collide with the cloud of Yb atoms 20 in the ion clock 10 of FIG. 10 to produce the Yb ions 22 by an impact ionization process.

The matter set forth in the foregoing description and accompanying drawings is offered by way of illustration only and not as a limitation. In other embodiments of the present invention, an edge-emitting semiconductor diode laser can substituted for the frequency-doubled VECSEL 42 to provide the 369-nm laser light 40. Edge-emitting semiconductor diode lasers which operate at 369 nm are well-known in the art (see e.g. M. A. Khan et al., "III—Nitride UV Devices," *Japanese Journal of Applied Physics*, vol. 44, pp. 7191-7206, 2005), and are available commercially. In other embodiments of the present invention, the vacuum package can be a permanently-sealed metal housing. Electrical connections can be made to the metal housing, for example, using welded electrical feedthroughs with the various light sources 26, 42 and 48 being coupled into the metal housing by one or more windows which are permanently-sealed onto the metal housing (e.g. by welding, brazing, soldering, or with an adhesive such as epoxy). Those skilled in the art will also understand that the microfabricated ion frequency standard 10 of the present invention can also be adapted for use with other types of ions by changing the wavelengths of the various light sources 26, 40 and 48 and the microwave radiation 34. The actual scope of the invention is intended to be defined in the following claims when viewed in their proper perspective based on the prior art.

What is claimed is:

1. A microfabricated ion frequency standard, comprising:
a source of ytterbium ions located within a permanently-sealed vacuum package, the source of the ytterbium ions comprising:
    a micro-hotplate having a suspended membrane whereon an electrical heater is located, and a layer of ytterbium in thermal communication with the electrical heater to generate a cloud of ytterbium atoms upon activation of the electrical heater; and
    an ionization source to ionize the ytterbium atoms in the cloud to generate the ytterbium ions;
an octupole ion trap located within the permanently-sealed vacuum package to confine the ytterbium ions, with the octupole ion trap being formed from a plurality of substrates which are stacked up, and with each substrate having an opening therethrough in which a pair of electrodes are suspended to provide an electric field which confines the ytterbium ions within a trap volume;
a microwave source to irradiate the ytterbium ions at a frequency which is substantially equal to a ground-state transition frequency of the ytterbium ions, thereby exciting the ytterbium ions from a ground-state lower hyperfine level into a ground-state upper hyperfine level;
a frequency-doubled vertical-external-cavity surface-emitting laser (VECSEL) to irradiate the ytterbium ions in the ground-state upper hyperfine level and thereby excite the ytterbium ions from the ground-state upper hyperfine level into an excited-state level, with the ytterbium ions in the excited-state level decaying from the excited-state level with the emission of fluorescent light; and a photodetector to detect the fluorescent light and to generate therefrom an electrical output signal which is provided in a feedback loop to tune the frequency of the microwave source to the ground-state transition frequency.

2. The apparatus of claim 1 wherein the ionization source comprises an ultraviolet light-emitting diode (LED) to photoionize the ytterbium atoms in the cloud and thereby generate the ytterbium ions.

3. The apparatus of claim 1 wherein the ionization source comprises a field-emission electron source to produce electrons which collide with the ytterbium atoms in the cloud to generate the ytterbium ions by electron impact ionization.

4. The apparatus of claim 1, wherein the permanently-sealed vacuum package comprises a low-temperature cofired ceramic (LTCC) housing.

5. The apparatus of claim 1 wherein the permanently-sealed vacuum package includes a non-evaporable getter.

6. The apparatus of claim 1 wherein the permanently-sealed vacuum package includes a buffer gas.

7. The apparatus of claim 1 wherein the permanently-sealed vacuum package includes a window to provide optical access to the trap volume.

8. The apparatus of claim 1 wherein the plurality of substrates comprise silicon substrates.

9. The apparatus of claim 1 wherein the electrodes comprise tungsten.

10. The apparatus of claim 1 wherein the microwave source comprises an acoustic oscillator.

11. The apparatus of claim 1 wherein the fluorescent light is directed to the photodetector by a diffractive optical element.

12. The apparatus of claim 1 further comprising a magnetic shield and at least one set of magnetic-field-cancelling coils located about the octupole ion trap to substantially cancel a background magnetic field within the trap volume, and to provide a C-field in the trap volume.

13. The apparatus of claim 1 further comprising a near-infrared light-emitting diode (LED) to generate near-infrared light to re-pump any of the ytterbium ions which decay from the excited-state level into a metastable excited-state level, and thereby excite the ytterbium ions from the metastable excited-state level into a higher-lying excited state wherefrom the ytterbium ions decay back to the ground-state lower hyperfine level.

14. A microfabricated ion frequency standard, comprising:
a permanently-sealed vacuum package having a window;
an octupole ion trap located within the permanently-sealed vacuum package, with the octupole ion trap comprising a plurality of substrates which are stacked one upon the other with an opening being formed through the substrates, and with a plurality of electrodes being located about the opening to define a trap volume for the octupole ion trap;
a micro-hotplate located within the permanently-sealed vacuum package, with the micro-hotplate comprising a suspended membrane whereon an electrical heater is located, and a layer of ytterbium in thermal communication with the electrical heater to generate a cloud of ytterbium atoms upon activation of the electrical heater, with the ytterbium atoms in the cloud being ionized to generate ytterbium ions which are then confined within the trap volume;
a microwave source located outside of the permanently-sealed vacuum package to provide microwave radiation at a frequency substantially equal to a ground-state transition frequency of the ytterbium ions, with the microwave radiation being coupled into the trap volume to excite the ytterbium ions from a ground-state lower hyperfine level into a ground-state upper hyperfine level;
a laser located outside of the permanently-sealed vacuum package to provide light at a wavelength of about 369 nanometers which is directed through the window to excite the ytterbium ions from the ground-state upper hyperfine level into an excited-state level wherefrom the ytterbium ions decay with the emission of fluorescent light; and
a photodetector located outside of the permanently-sealed vacuum package to detect the fluorescent light emitted by the ytterbium ions and to generate an electrical output signal which is provided in a feedback loop to the microwave source to tune the frequency of the microwave source to the ground-state transition frequency.

15. The apparatus of claim 14 further comprising a near-infrared LED located outside of the permanently-sealed vacuum package to generate near-infrared light which is directed through the window to stimulate any of the ytterbium ions in a metastable excited-state level to return back to the ground-state lower hyperfine level.

16. The apparatus of claim 14 wherein the ytterbium atoms are ionized by ultraviolet light from an ultraviolet light-emitting diode (LED) which is located outside the permanently-sealed vacuum package with the ultraviolet light being coupled into the permanently-sealed vacuum package through the window therein.

17. The apparatus of claim 14 wherein the ytterbium atoms are ionized by electrons generated by a field-emission electron source which is located inside the permanently-sealed vacuum package.

18. The apparatus of claim 14 wherein the microwave source comprises an acoustic bandgap (ABG) oscillator, a microresonator oscillator, or a film bulk acoustic wave (FBAR) oscillator.

19. The apparatus of claim 14 wherein the laser comprises a frequency-doubled vertical-external-cavity surface-emitting laser (VECSEL).

20. The apparatus of claim 14 wherein the fluorescent light is directed to the photodetector by a diffractive optical element.

21. The apparatus of claim 14 further comprising a 45-degree turning mirror located inside the permanently-sealed vacuum package to direct the light at the wavelength of about 369 nanometers into the trap volume along a longitudinal axis of the octupole ion trap.

22. The apparatus of claim 14 wherein the permanently-sealed vacuum package includes a non-evaporable getter and a buffer gas.

23. The apparatus of claim 14 wherein the permanently-sealed vacuum package comprises a low-temperature cofired ceramic (LTCC) housing.

* * * * *